(12) United States Patent
Sugimoto et al.

(10) Patent No.: US 10,201,077 B2
(45) Date of Patent: Feb. 5, 2019

(54) SUSPENSION BOARD ASSEMBLY SHEET HAVING CIRCUITS, METHOD OF MANUFACTURING THE SAME AND METHOD OF INSPECTING THE SAME

(71) Applicant: Nitto Denko Corporation, Ibaraki-shi, Osaka (JP)

(72) Inventors: Yuu Sugimoto, Ibaraki (JP); Hiroyuki Tanabe, Ibaraki (JP); Naohiro Terada, Ibaraki (JP)

(73) Assignee: NITTO DENKO CORPORATION, Ibaraki-shi, Osaka (JP)

(*) Notice: Subject to any disclaimer, the term of this patent is extended or adjusted under 35 U.S.C. 154(b) by 272 days.

(21) Appl. No.: 15/208,655

(22) Filed: Jul. 13, 2016

(65) Prior Publication Data

US 2017/0019985 A1 Jan. 19, 2017

(30) Foreign Application Priority Data

Jul. 13, 2015 (JP) ................................. 2015-139801

(51) Int. Cl.
*H05K 1/14* (2006.01)
*H01L 23/522* (2006.01)
(Continued)

(52) U.S. Cl.
CPC ............ *H05K 1/0268* (2013.01); *G01R 1/04* (2013.01); *G11B 5/486* (2013.01); *H05K 1/115* (2013.01);
(Continued)

(58) Field of Classification Search
CPC .... H05K 1/0268; H05K 3/0097; H05K 1/142; H05K 1/115; H05K 3/424;
(Continued)

(56) References Cited

U.S. PATENT DOCUMENTS

2012/0092794 A1  4/2012  Ohsawa
2013/0020112 A1  1/2013  Ohsawa
(Continued)

FOREIGN PATENT DOCUMENTS

JP  2012018984 A  1/2012
JP  2012104210 A  5/2012
(Continued)

*Primary Examiner* — Farhana Hoque
(74) *Attorney, Agent, or Firm* — Panitch Schwarze Belisario & Nadel LLP

(57) ABSTRACT

A suspension board and an inspection substrate are integrally supported by a support frame. In the suspension board, first and second insulating layers are laminated on a support substrate in this order. Part of a line is formed on the first insulating layer, and the remaining line is formed on the second insulating layer. A via connecting the part of the line to the remaining line is formed in the second insulating layer. In the inspection substrate, the first and second insulating layers are laminated on the support substrate in this order. A first inspection conductor layer is formed on the first insulating layer, and a second inspection conductor layer is formed on the second insulating layer. A via connecting the first inspection conductor layer to the second inspection conductor layer is formed in the second insulating layer.

20 Claims, 25 Drawing Sheets

(51) Int. Cl.
*H05K 1/02* (2006.01)
*H05K 1/11* (2006.01)
*H05K 3/42* (2006.01)
*H05K 3/00* (2006.01)
*G01R 1/04* (2006.01)
*G11B 5/48* (2006.01)

(52) U.S. Cl.
CPC ........... *H05K 1/142* (2013.01); *H05K 3/0097* (2013.01); *H05K 3/424* (2013.01); *H05K 2203/0165* (2013.01); *H05K 2203/162* (2013.01)

(58) Field of Classification Search
CPC ..... H05K 2203/162; H05K 2203/0165; G01R 1/04; G11B 5/486

USPC ...................... 324/756.07; 361/784; 257/758
See application file for complete search history.

(56) References Cited

U.S. PATENT DOCUMENTS

| | | |
|---|---|---|
| 2013/0126223 A1 | 5/2013 | Yamauchi |
| 2014/0126169 A1* | 5/2014 | Ihara ...................... G11B 5/486 |
| | | 361/784 |
| 2015/0181695 A1 | 6/2015 | Ichinose et al. |

FOREIGN PATENT DOCUMENTS

| | | |
|---|---|---|
| JP | 2013109803 A | 6/2013 |
| JP | 2014096423 A | 5/2014 |
| JP | 2015118721 A | 6/2015 |

* cited by examiner

F I G. 5
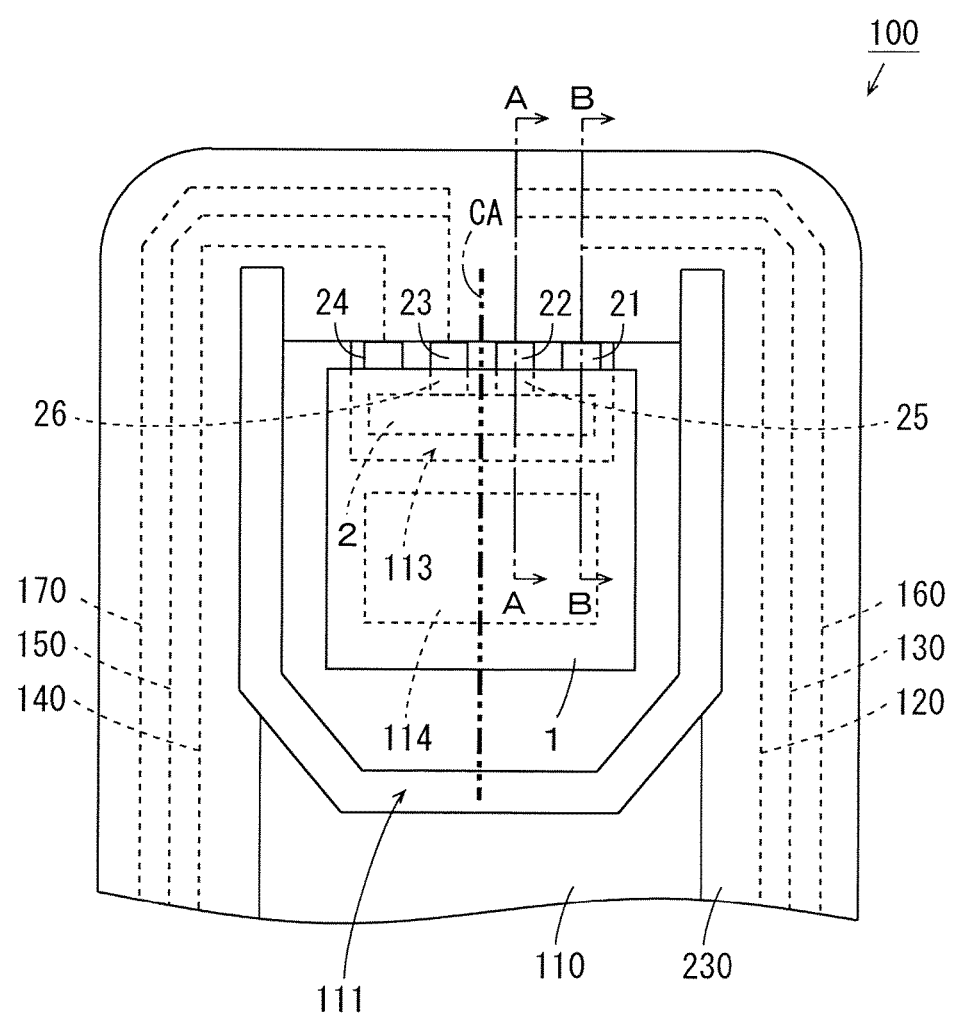

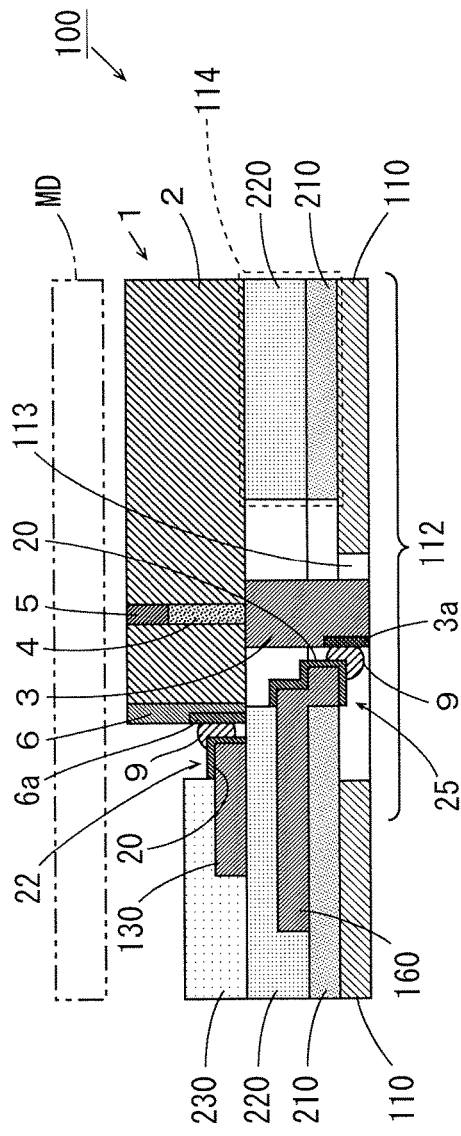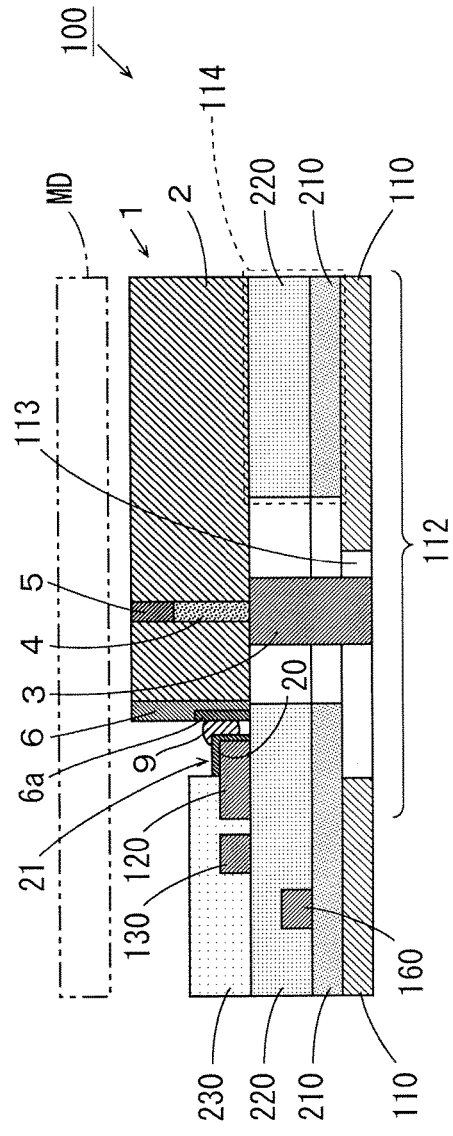

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

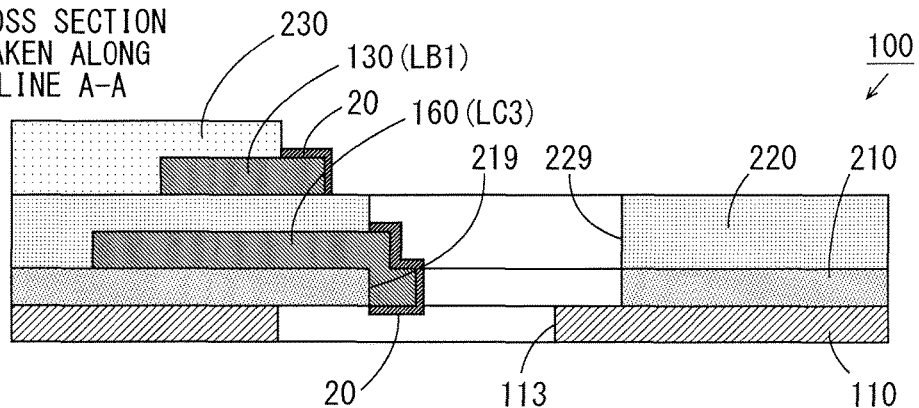
FIG. 19A CROSS SECTION TAKEN ALONG LINE A-A
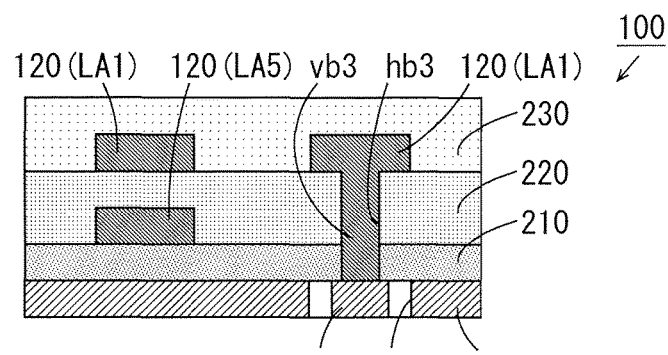
FIG. 19B CROSS SECTION TAKEN ALONG LINE C-C
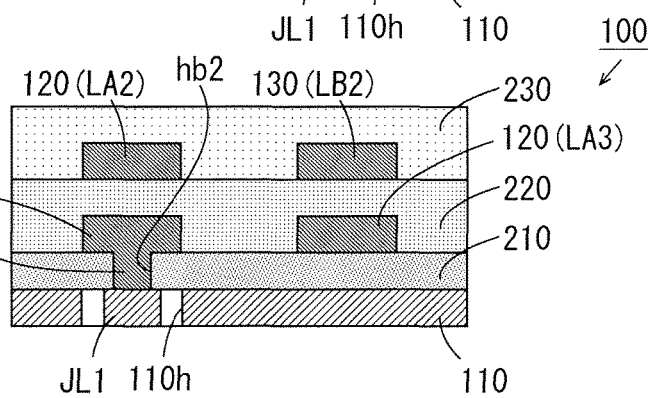
FIG. 19C CROSS SECTION TAKEN ALONG LINE D-D
FIG. 19D LONGITUDINAL CROSS SECTION OF INSPECTION SUBSTRATE
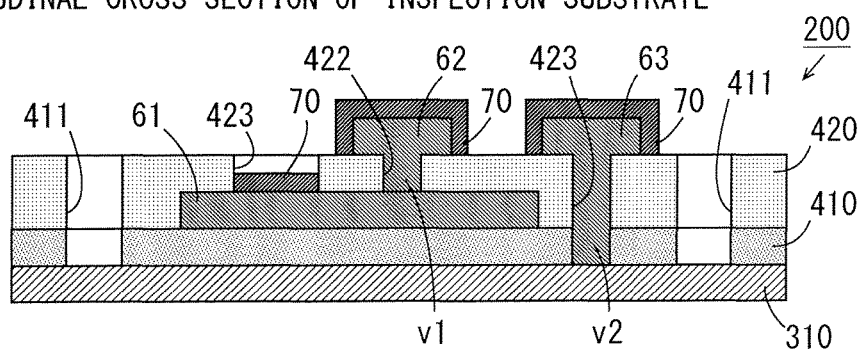

CROSS SECTION TAKEN ALONG LINE A-A

CROSS SECTION TAKEN ALONG LINE C-C

CROSS SECTION TAKEN ALONG LINE D-D

LONGITUDINAL CROSS SECTION OF INSPECTION SUBSTRATE

F I G. 2 7
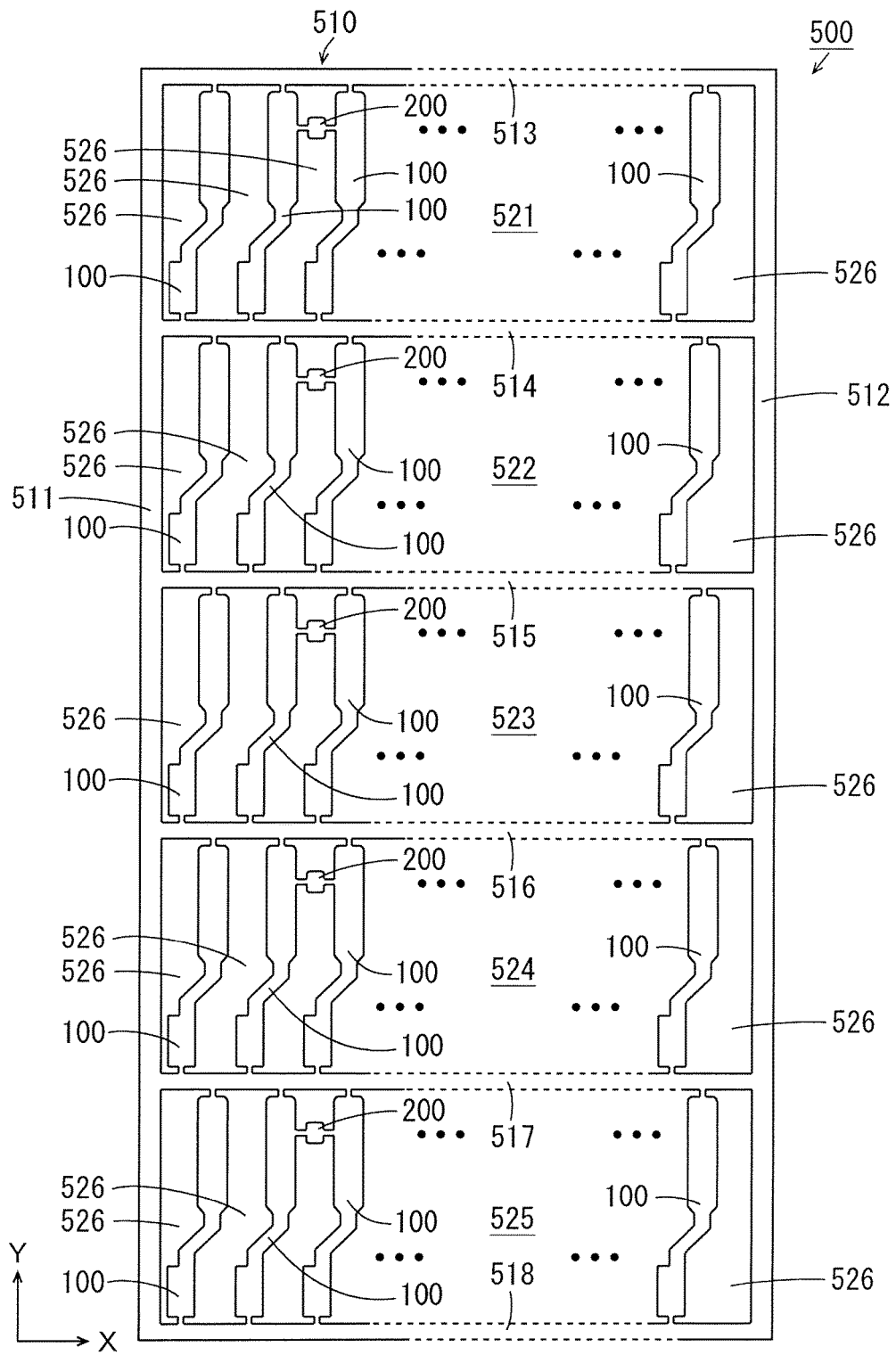

SUSPENSION BOARD ASSEMBLY SHEET HAVING CIRCUITS, METHOD OF MANUFACTURING THE SAME AND METHOD OF INSPECTING THE SAME

BACKGROUND OF THE INVENTION

Field of the Invention

The present invention relates to a suspension board assembly sheet having circuits, a method of manufacturing the suspension board assembly sheet having circuits, and a method of inspecting the suspension board assembly sheet having circuits.

Description of Related Art

An actuator is used for a drive device such as a hard disc drive device. Such an actuator includes an arm rotatably provided at a rotation shaft and a suspension board having a circuit (hereinafter abbreviated as a suspension board) for a magnetic head attached to the arm. The suspension board is a printed circuit board for positioning the magnetic head at a desired track of a magnetic disc.

The suspension board includes the magnetic head and is connected to another electronic circuit. A conductor trace is formed at the suspension board, and an electrical signal is transmitted between the other electronic circuit and the magnetic head through the conductor trace. The plurality of suspension boards having such a configuration are formed to be integrally supported at a common support frame in the manufacturing process (see JP 2012-18984 A, for example).

In each suspension board, a ground wiring layer (a wiring layer for ground) and a signal wiring layer (a wiring layer for a signal) are formed on a metal support substrate with an insulating layer sandwiched therebetween. The ground wiring layer and the metal support substrate are electrically connected to each other by a via plating portion penetrating the insulating layer. Further, in the support frame, a conductor layer is formed on the metal support substrate with the insulating layer sandwiched therebetween.

BRIEF SUMMARY OF THE INVENTION

In JP 2012-18984 A, the suspension board having the support frame, which has an inspection via plating portion (a via plating portion for inspection) at the support frame, is described. According to JP 2012-18984 A, inspection of the inspection via plating portion of the support frame is performed, whereby it is possible to perform inspection of the via plating portion of each of the plurality of suspension boards without performing inspection of the via plating portion of each of the plurality of suspension boards directly and respectively. Thus, an inspection time period for the via plating portions of the plurality of suspension boards is shortened. However, a state of the inspection via plating portion and a state of the via plating portion of each suspension board described in JP 2012-18984 A do not necessarily have a high correlation. Therefore, reliability of the result of inspection is low.

An object of the present invention is to provide a suspension board assembly sheet having circuits for which inspection of vias of a plurality of suspension boards can be performed in a short period of time, and reliability of a result of inspection can be improved, a method of manufacturing the suspension board assembly sheet having circuits, and a method of inspecting the suspension board assembly sheet having circuits.

(1) A suspension board assembly sheet having circuits according to one aspect of the present invention includes a plurality of suspension boards having circuits, an inspection substrate, and a support frame that integrally supports the plurality of suspension boards having circuits and the inspection substrate, wherein each of the plurality of suspension boards having circuits includes a conductive circuit support substrate, a first circuit insulating layer formed on the circuit support substrate, a first conductor line formed on the first circuit insulating layer, a second circuit insulating layer formed on the first circuit insulating layer to cover at least part of the first conductor line, a second conductor line formed on the second circuit insulating layer, and a first circuit via that electrically connects the first conductor line to the second conductor line through the second circuit insulating layer, the inspection substrate includes a conductive inspection support substrate, a first inspection insulating layer formed on the inspection support substrate, a first inspection conductor layer formed on the first inspection insulating layer, a second inspection insulating layer formed on the first inspection insulating layer to cover at least part of the first inspection conductor layer, a second inspection conductor layer formed on the second inspection insulating layer, and a first inspection via that electrically connects the first inspection conductor layer to the second inspection conductor layer through the second inspection insulating layer, and the first circuit via and the first inspection via have a same configuration.

In the suspension board assembly sheet having circuits, the plurality of the suspension board having circuits and the inspection substrate are integrally supported by the support frame.

In each of the plurality of suspension boards having circuits, the first circuit insulating layer is formed on the conductive circuit support substrate. The first conductor line is formed on the first circuit insulating layer. Further, the second circuit insulating layer is formed on the first circuit insulating layer to cover at least part of the first conductor line. Further, the second conductor line is formed on the second circuit insulating layer. The first conductor line and the second conductor line are electrically connected to each other by the first circuit via passing through the second circuit insulating layer.

In the inspection substrate, the first inspection insulating layer is formed on the conductive inspection support substrate. The first inspection conductor layer is formed on the first inspection insulating layer. Further, the second inspection insulating layer is formed on the first inspection insulating layer to cover at least part of the first inspection conductor layer. Further, the second inspection conductor layer is formed on the second inspection insulating layer. The first inspection conductor layer and the second inspection conductor layer are electrically connected to each other by the first inspection via passing through the second inspection insulating layer.

The inspection substrate is formed to be integrally supported at the support frame similarly to the plurality of suspension boards having circuits, and the first circuit via of each of the plurality of suspension boards having circuits and the first inspection via of the inspection substrate have the same configuration. Thus, the state of the first circuit via and the state of the first inspection via have a high correlation. Therefore, the electric characteristics are measured for the first inspection via of the inspection substrate, whereby the inspection of the first circuit vias of the plurality of suspension boards having circuits can be performed in a short period of time, and reliability of the result of inspection can be improved.

(2) Each of the plurality of suspension boards having circuits may further include a second circuit via that electrically connects the circuit support substrate to the second conductor line through the first and second circuit insulating layers, the inspection substrate may further include a second inspection via that electrically connects the inspection support substrate to the second inspection conductor layer through the first and second inspection insulating layers, and the second circuit via and the second inspection via may have a same configuration.

In this case, in each of the plurality of suspension boards having circuits, the circuit support substrate and the second conductor layer are electrically connected to each other by the second circuit via passing through the first and second circuit insulating layers. In the inspection substrate, the inspection support substrate and the second inspection conductor layer are electrically connected to each other by the second inspection via passing through the first and second inspection insulating layers.

Because the second circuit via of each of the plurality of suspension boards having circuits and the second inspection via of the inspection substrate have the same configuration, the state of the second circuit via and the state of the second inspection via have a high correlation. Therefore, the electric characteristics are measured for the second inspection via of the inspection substrate, whereby the inspection of the second circuit vias of the plurality of suspension boards having circuits can be performed in a short period of time, and reliability of the result of inspection can be improved.

(3) Each of the plurality of suspension boards having circuits may further include a third circuit via that electrically connects the circuit support substrate to the first conductor line through the first circuit insulating layer, the inspection substrate may further include a third inspection via that electrically connects the inspection support substrate to the first inspection conductor layer through the first inspection insulating layer, and the third circuit via and the third inspection via may have a same configuration.

In this case, in each of the plurality of suspension boards having circuits, the circuit support substrate and the first conductor line are electrically connected to each other by the third circuit via passing through the first circuit insulating layer. In the inspection substrate, the inspection support substrate and the first inspection conductor layer are electrically connected to each other by the third inspection via passing through the first inspection insulating layer.

Because the third circuit via of each of the plurality of suspension boards having circuits and the third inspection via of the inspection substrate have the same configuration, the state of the third circuit via and the state of the third inspection via have a high correlation. Therefore, the electric characteristics are measured for the third inspection via of the inspection substrate, whereby the inspection of the third circuit vias of the plurality of suspension boards having circuits can be performed in a short period of time, and reliability of the result of inspection can be improved.

(4) The circuit support substrate may include a circuit supporter that supports the first circuit insulating layer, the first conductor line, the second circuit insulating layer, and the second conductor line, and a circuit connector that is electrically connected to the third circuit via and electrically separated from the circuit supporter, and the inspection support substrate may include an inspection supporter that supports the first inspection insulating layer, the first inspection conductor layer, the second inspection insulating layer and the second inspection conductor layer, and an inspection connector that is electrically connected to the third inspection via and electrically separated from the inspection supporter.

In this case, in the circuit support substrate, because the circuit supporter and the circuit connector are electrically separated from each other, the circuit connector can be used as part of the wire connected to the first conductor line. Further, in the inspection support substrate, similarly to the circuit support substrate, the inspection supporter and the inspection connector are electrically separated from each other.

Therefore, because the circuit support substrate and the inspection support substrate have the same configuration, the state of the first circuit via and the state of the first inspection via have a higher correlation. Therefore, the electric characteristics are measured for the first inspection via of the inspection substrate, whereby reliability of the result of inspection of the first circuit via of each of the plurality of suspension boards having circuits can be more sufficiently improved.

Further, in the above-mentioned configuration, because the inspection supporter and the inspection connector are electrically separated from each other, electric power can be supplied to the first inspection conductor layer from the inspection connector through the third inspection via.

(5) The second inspection insulating layer may have an opening from which part of the first inspection conductor layer is exposed.

In this case, when the electric characteristics of the first inspection via are inspected, a probe of the inspection device can be easily brought into contact with the first inspection conductor layer exposed in the opening. Thus, the electric characteristics of the first inspection via can be measured efficiently and easily.

(6) A suspension board assembly sheet having circuits according to another aspect of the present invention includes a plurality of suspension boards having circuits, an inspection substrate, and a support frame that integrally supports the plurality of suspension boards having circuits and the inspection substrate, wherein each of the plurality of suspension boards having circuits includes a conductive circuit support substrate, a first circuit insulating layer formed on the circuit support substrate, a first conductor line formed on the first circuit insulating layer, a second circuit insulating layer formed on the first circuit insulating layer to cover at least part of the first conductor line, a second conductor line formed on the second circuit insulating layer, and a circuit via that electrically connects the circuit support substrate to the second conductor line through the first and second circuit insulating layers, the inspection substrate includes a conductive inspection support substrate, a first inspection insulating layer formed on the inspection support substrate, a second inspection insulating layer formed on the first inspection insulating layer, an inspection conductor layer formed on the second inspection insulating layer, and an inspection via that electrically connects the inspection support substrate to the inspection conductor layer through the first and second inspection insulating layers, and the circuit via and the inspection via have a same configuration.

In the suspension board assembly sheet having circuits, the plurality of suspension boards having circuits and the inspection substrate are integrally supported by the support frame.

In each of the plurality of suspension boards having circuits, the first circuit insulating layer is formed on the conductive circuit support substrate. The first conductor line is formed on the first circuit insulating layer. Further, the second circuit insulating layer is formed on the first circuit insulating layer to cover at least part of the first conductor line. Further, the second conductor line is formed on the second circuit insulating layer. The circuit support substrate and the second conductor line are electrically connected to each other by the circuit via passing through the first and second circuit insulating layers.

In the inspection substrate, the first inspection insulating layer is formed on the conductive inspection support substrate. The second inspection insulating layer is formed on the first inspection insulating layer. Further, the inspection conductor layer is formed on the second inspection insulating layer. The inspection support substrate and the inspection conductor layer are electrically connected to each other by the inspection via passing through the first and second inspection insulating layers.

The inspection substrate is formed to be integrally supported at the support frame similarly to the plurality of suspension boards having circuits, and the circuit via of each of the plurality of suspension boards having circuits and the inspection via of the inspection substrate have the same configuration. Thus, the state of the circuit via and the state of the inspection via have a high correlation. Therefore, the electric characteristics are measured for the inspection via of the inspection substrate, whereby the inspection of the circuit vias of the plurality of suspension boards having circuits can be performed in a short period of time, and reliability of the result of inspection can be improved.

(7) The first and second inspection insulating layers may have an opening from which part of the inspection support substrate is exposed.

In this case, when the electric characteristics of the inspection via are inspected, a probe of the inspection device can be easily brought into contact with the inspection support substrate exposed in the opening. Thus, the electric characteristics of the inspection via can be measured efficiently and easily.

(8) The support frame may surround at least part of the plurality of suspension boards having circuits, and the inspection substrate may be arranged in a region surrounded by the support frame.

In this case, the inspection substrate is arranged near the plurality of suspension boards having circuits. Thus, a correlation between the state of the first circuit via and the state of the first inspection via, and a correlation between the state of the circuit via and the state of the inspection via can be improved.

(9) The support frame may surround the plurality of suspension boards having circuits, and the plurality of suspension boards having circuits and the inspection substrate may be supported in alignment at the support frame.

In this case, it is possible to form a larger number of suspension boards having circuits and the inspection substrate at the suspension board assembly sheet having circuits without increasing the size of the support frame. Thus, a manufacturing cost of the suspension board assembly sheet having circuits can be reduced.

(10) The inspection substrate may be arranged between a suspension board having a circuit at an end of the plurality of suspension boards having circuits, and a portion of the support frame. In this case, the inspection of the inspection substrate can be easily performed.

(11) The inspection substrate may be arranged between a pair of adjacent suspension boards having circuits of the plurality of suspension boards having circuits.

In this case, a correlation between the state of the first circuit via and the state of the first inspection via, or a correlation between the state of the circuit via and the state of the inspection via can be more sufficiently improved.

(12) A method of manufacturing a suspension board assembly sheet having circuits including a plurality of suspension boards having circuits according to yet another aspect of the present invention, an inspection substrate and a support frame that integrally supports the plurality of suspension boards having circuits and the inspection substrate includes the steps of preparing a base material having a laminated structure of a conductive support substrate and an insulating layer, forming a plurality of first circuit insulating layers for the plurality of suspension boards having circuits and a first inspection insulating layer for the inspection substrate by processing the insulating layer, respectively forming a plurality of first conductor lines on the plurality of first circuit insulating layers, and forming a first inspection conductor layer on the first inspection insulating layer, respectively forming a plurality of second circuit insulating layers on the plurality of first circuit insulating layers to cover at least part of the plurality of first conductor lines, and forming a second inspection insulating layer on the first inspection insulating layer to cover at least part of the first inspection conductor layer, respectively forming a plurality of first circuit vias electrically connected to the plurality of first conductor lines in the plurality of second circuit insulating layers, respectively forming a plurality of second conductor lines on the plurality of second circuit insulating layers to be electrically connected to the plurality of first circuit vias, forming a first inspection via electrically connected to the first inspection conductor layer in the second inspection insulating layer, and forming a second inspection conductor layer on the second inspection insulating layer to be electrically connected to the first inspection via, and fabricating the plurality of suspension boards having circuits, the inspection substrate and the support frame by removing a region of the support substrate except for a region for the plurality of suspension boards having circuits, a region for the inspection substrate, and a region for the support frame in the support substrate.

In the suspension board assembly sheet having circuits manufactured by the manufacturing method, the plurality of suspension board having circuits and the inspection substrate are integrally supported by the support frame.

In each of the plurality of suspension boards having circuits, the first circuit insulating layer is formed on the support substrate. The first conductor line is formed on the first circuit insulating layer. Further, the second circuit insulating layer is formed on the first circuit insulating layer to cover at least part of the first conductor line. Further, the second conductor line is formed on the second circuit insulating layer. The first conductor line and the second conductor line are electrically connected to each other by the first circuit via passing through the second circuit insulating layer.

In the inspection substrate, the first inspection insulating layer is formed on the support substrate. The first inspection conductor layer is formed on the first inspection insulating layer. Further, the second inspection insulating layer is formed on the first inspection insulating layer to cover at least part of the first inspection conductor layer. Further, the second inspection conductor layer is formed on the second inspection insulating layer. The first inspection conductor layer and the second inspection conductor layer are electrically connected to each other by the first inspection via passing through the second inspection insulating layer.

The inspection substrate is formed to be integrally supported at the support frame similarly to the plurality of suspension boards having circuits, and the first circuit via of each of the plurality of suspension boards having circuits and the first inspection via of the inspection substrate have the same configuration. Thus, the state of the first circuit via and the state of the first inspection via have a high correlation. Therefore, the electric characteristics are measured for the first inspection via of the inspection substrate, whereby the inspection of the first circuit vias of the plurality of suspension boards having circuits can be performed in a short period of time, and reliability of the result of inspection can be improved.

(13) The step of forming the plurality of second conductor lines and the second inspection conductor layer may include respectively forming a plurality of second circuit vias electrically connected to the support substrate in the plurality of first and second circuit insulating layers, respectively forming the plurality of second conductor lines on the plurality of second circuit insulating layers to be electrically connected to the plurality of second circuit vias, forming a second inspection via electrically connected to the support substrate in the first and second insulating layers, and forming the second inspection conductor layer on the second inspection insulating layer to be electrically connected to the second inspection via.

In each of the plurality of suspension boards having circuits manufactured by the manufacturing method, the support substrate and the second conductor line are electrically connected to each other by the second circuit via passing through the first and second circuit insulating layers. In the inspection substrate, the support substrate and the second inspection conductor layer are electrically connected to each other by the second inspection via passing through the first and second inspection insulating layer.

Because the second circuit via of each of the plurality of suspension boards having circuits and the second inspection via of the inspection substrate have the same configuration, the state of the second circuit via and the state of the second inspection via have a high correlation. Therefore, the electric characteristics are measured for the second inspection via of the inspection substrate, whereby the inspection of the second circuit vias of the plurality of suspension boards having circuits can be performed in a short period of time, and reliability of the result of inspection can be improved.

(14) A method of manufacturing a suspension board assembly sheet having circuits including a plurality of suspension boards having circuits, an inspection substrate and a support frame that integrally supports the plurality of suspension boards having circuits and the inspection substrate according to yet another aspect of the present invention includes the steps of preparing a base material having a laminated structure of a conductive support substrate and an insulating layer, forming a plurality of first circuit insulating layers for the plurality of suspension boards having circuits and a first inspection insulating layer for the inspection substrate by processing the insulating layer, respectively forming a plurality of first conductor lines on the plurality of first circuit insulating layers, respectively forming a plurality of second circuit insulating layers on the plurality of first circuit insulating layers to cover at least part of the plurality of first conductor lines, and forming a second inspection insulating layer on the first inspection insulating layer, respectively forming a plurality of circuit vias electrically connected to the support substrate in the plurality of first and second circuit insulating layers, respectively forming a plurality of second conductor lines on the plurality of second circuit insulating layers to be electrically connected to the plurality of circuit vias, forming an inspection via electrically connected to the support substrate in the first and second inspection insulating layers, and forming an inspection conductor layer on the second inspection insulating layer to be electrically connected to the inspection via, and fabricating the plurality of suspension boards having circuits, the inspection substrate and the support frame by removing a region of the support substrate except for a region for the plurality of suspension boards having circuits, a region for the inspection substrate and a region for the support frame in the support substrate.

In the suspension board assembly sheet having circuits manufactured by the manufacturing method, the plurality of suspension boards having circuits and the inspection substrate are integrally supported at the support frame.

In each of the plurality of suspension boards having circuits, the first circuit insulating layer is formed on the support substrate. The first conductor line is formed on the first circuit insulating layer. Further, the second circuit insulating layer is formed on the first circuit insulating layer to cover at least part of the first conductor line. Further, the second conductor line is formed on the second circuit insulating layer. The support substrate and the second conductor line are electrically connected to each other by the circuit via passing through the first and second circuit insulating layers.

In the inspection substrate, the first inspection insulating layer is formed on the support substrate. The second inspection insulating layer is formed on the first inspection insulating layer. Further, the inspection conductor layer is formed on the second inspection insulating layer. The support substrate and the inspection conductor layer are electrically connected to each other by the inspection via passing through the first and second inspection insulating layers.

The inspection substrate is formed to be integrally supported at the support frame similarly to the plurality of suspension boards having circuits, and the circuit via of each of the plurality of suspension boards having circuits and the inspection via of the inspection substrate have the same configuration. Thus, the state of the circuit via and the state of the inspection via have a high correlation. Therefore, the electric characteristics are measured for the inspection via of the inspection substrate, whereby the inspection of the circuit vias of the plurality of suspension boards having circuits can be performed in a short period of time, and reliability of the result of inspection can be improved.

(15) A method of inspecting a suspension board assembly sheet having circuits according to yet another aspect of the present invention includes the steps of preparing the suspension board assembly sheet having circuits according to the one aspect of the present invention, and performing inspection of the first circuit via by measuring electric characteristics of the first inspection via.

According to the inspection method, the electric characteristics are measured for the first inspection via of the inspection substrate, whereby the inspection of the first circuit vias of the plurality of suspension boards having circuits can be performed in a short period of time, and reliability of the result of inspection can be improved.

(16) A method of inspecting a suspension board assembly sheet having circuits according to yet another aspect of the present invention includes the steps of preparing the suspension board assembly sheet having circuits according to the other aspect of the present invention, and performing inspection of the circuit via by measuring electric characteristics of the inspection via.

According to the inspection method, the electric characteristics are measured for the inspection via of the inspection substrate, whereby the inspection of the circuit vias of the plurality of suspension boards having circuits can be performed in a short period of time, and reliability of the result of inspection can be improved.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 5 is a partially enlarged plan view of the suspension board showing a slider being attached to a tongue of FIG. 4;

FIG. 6A is a cross sectional view taken along the line A-A of FIG. 5;

FIG. 6B is a cross sectional view taken along the line B-B of FIG. 5;

FIGS. 19A to 19D are cross sectional views showing a process of the one example of the method of manufacturing the assembly sheet according to the first embodiment;

FIG. 27 is a top view of an assembly sheet according to an eighth embodiment.

DESCRIPTION OF THE PREFERRED EMBODIMENTS

[1] First Embodiment

A suspension board assembly sheet having circuits and a method of manufacturing the suspension board assembly sheet having circuits according to one embodiment of the present invention will be described below with reference to drawings. The suspension board assembly sheet having circuits (hereinafter abbreviated as an assembly sheet) is a semi-finished product in the process of manufacturing a suspension board having a circuit (hereinafter abbreviated as a suspension board). First, the configuration of the assembly sheet will be described.

(1) Assembly Sheet

Figure 1:
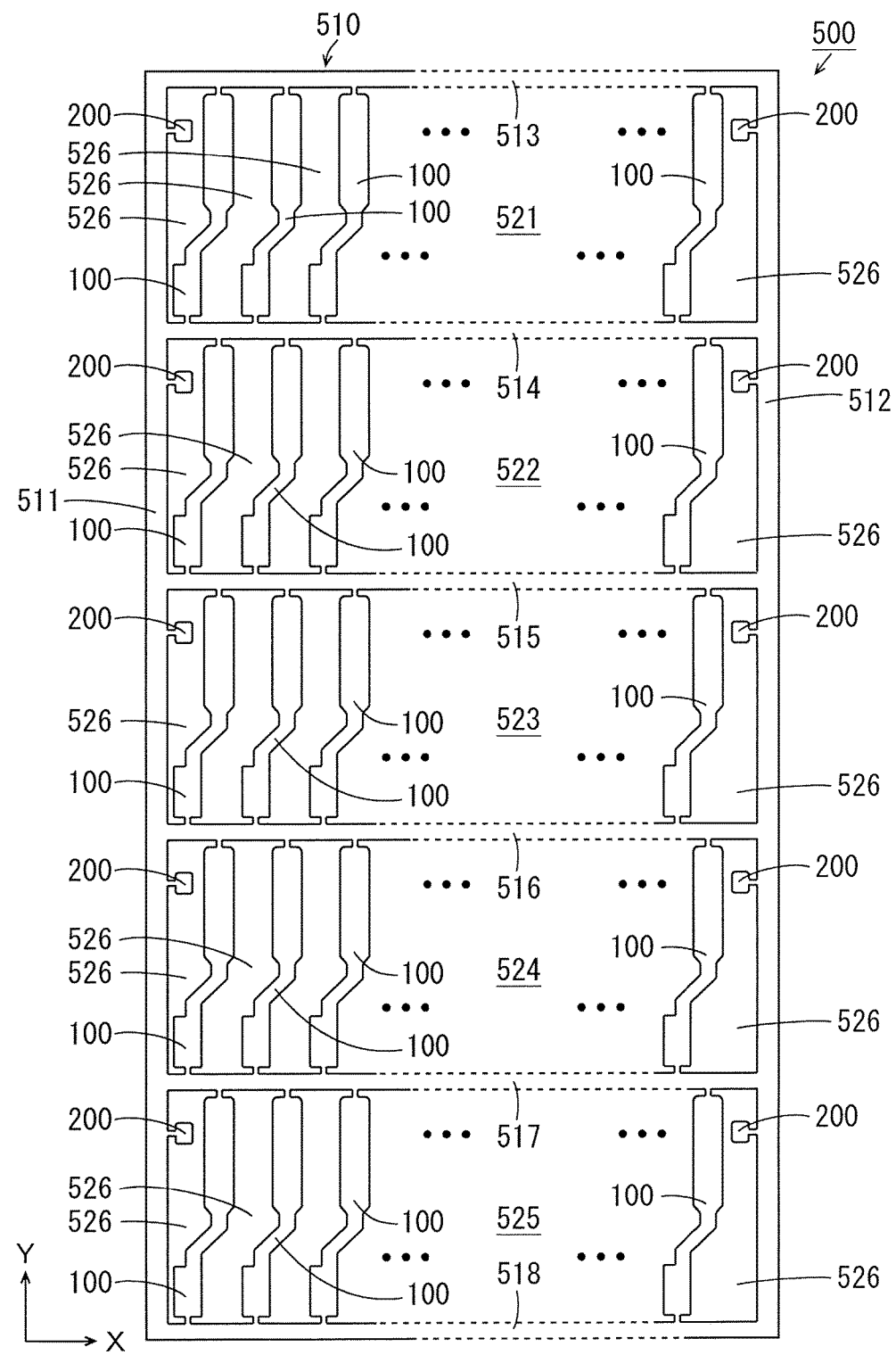
FIG. 1 is a top view of an assembly sheet according to a first embodiment.
Figure 2:
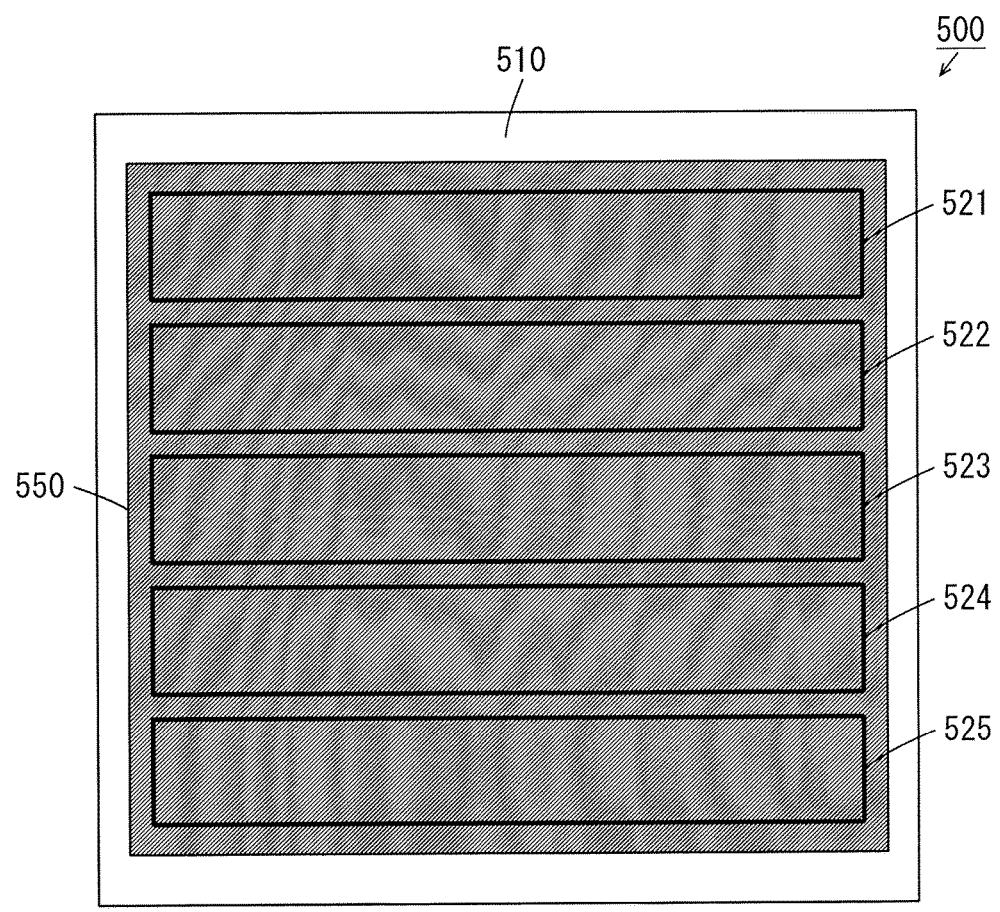
FIG. 2 is a top view of the assembly sheet according to the first embodiment.
Figure 3:
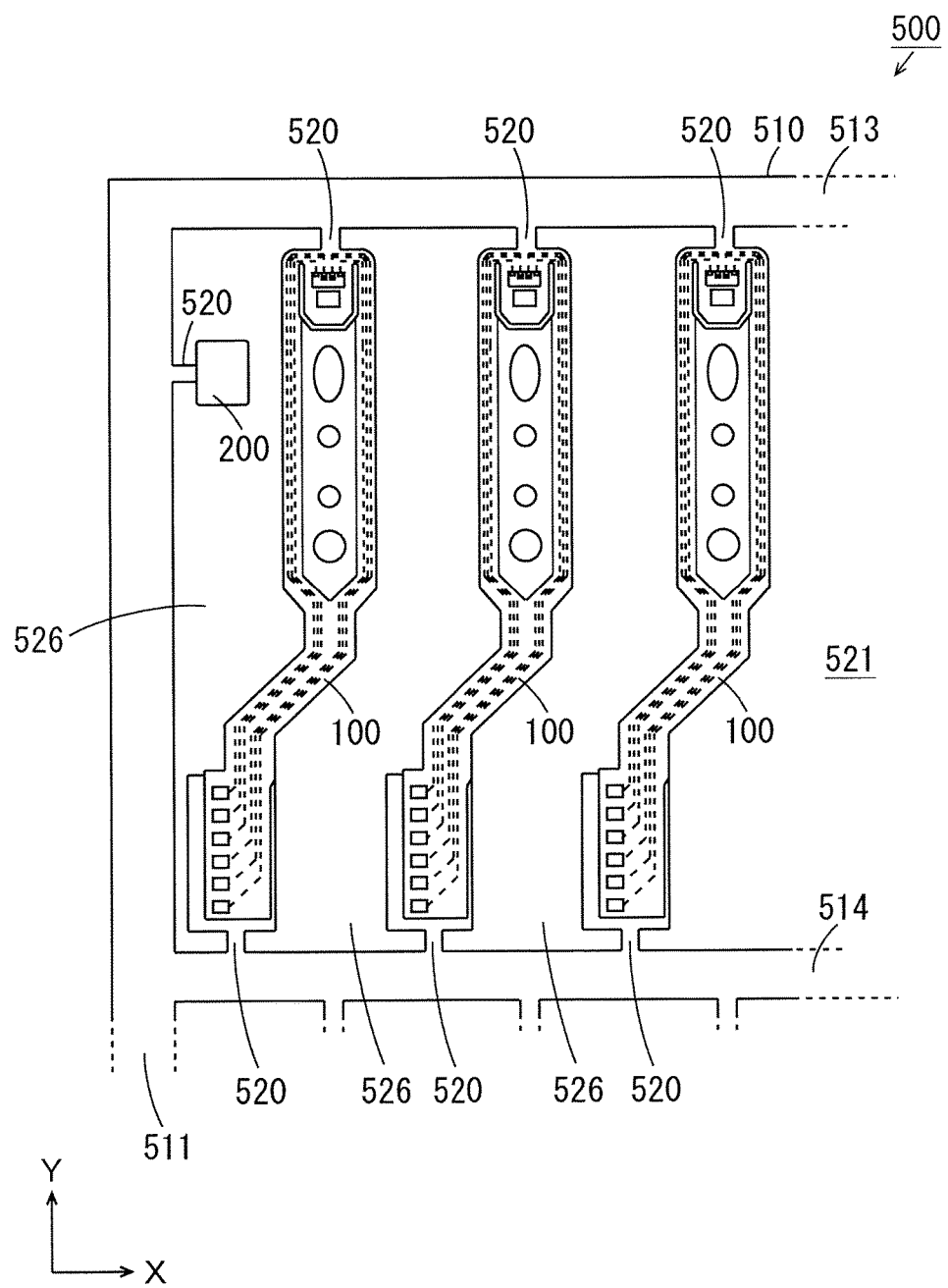
FIG. 3 is a partially enlarged top view of the assembly sheet of FIG. 1.

Each of FIGS. 1 and 2 is a top view of the assembly sheet according to the first embodiment. Further, FIG. 3 is a partially enlarged top view of the assembly sheet 500 of FIG. 1. The assembly sheet 500 is fabricated of an elongated metallic support substrate. In each of FIGS. 1 and 3, two directions that are orthogonal to each other are defined as an X direction and a Y direction as indicated by arrows X, Y. In the present example, the X direction and the Y direction are in parallel with a horizontal plane. At the time of manufacturing, the plurality of assembly sheets 500 are fabricated at the elongated support substrate to be arranged in a longitudinal direction. In FIG. 1, one assembly sheet 500 on the support substrate is shown.

The assembly sheet 500 has a rectangular outer shape, and includes a support frame 510, a plurality of elongated suspension boards 100 and a plurality of inspection substrates 200 (substrates 200 for inspection). As shown in FIG. 2, a region (hereinafter referred to as a product guarantee region) 550 is set inside of the support frame 510 in the assembly sheet 500. In FIG. 2, the product guarantee region 550 is indicated by a hatching pattern. The product guarantee region 550 is a region in which each suspension board 100 is to be protected to satisfy a predetermined specification.

As shown in FIG. 1, the support frame 510 is constituted by a pair of side frames 511, 512 and a plurality of end frames 513, 514, 515, 516, 517, 518. The pair of side frames 511, 512 is opposite to each other and extends in the Y direction. The end frames 513 to 518 respectively extend in the X direction that is orthogonal to the pair of side frames 511, 512, and are respectively formed to connect the pair of side frames 511, 512. The end frames 513 to 518 are arranged at equal intervals in the Y direction from the one end to the other end of the pair of side frames 511, 512. Thus, a plurality (five in the present example) of rectangular regions 521, 522, 523, 524, 525 that are partitioned by the side frames 511, 512 and the end frames 513 to 518 are formed inside of the product guarantee region 550. In FIG. 2, the rectangular regions 521 to 525 inside of the product guarantee region 550 are surrounded by thick solid lines.

The plurality of suspension boards 100 are provided to extend in the Y direction and be arranged in the X direction in the rectangular regions 521 to 525. A separation groove 526 is formed along an outer peripheral edge of each suspension board 100. In the present embodiment, in each of the rectangular regions 521 to 525, the inspection substrate 200 is provided in a separation groove 526 between the suspension board 100 at one end in the X direction and the side frame 511. Further, in each of the rectangular regions 521 to 525, the inspection substrate 200 is provided in a separation groove 526 between the suspension board 100 at the other end in the X direction and the side frame 512.

As shown in FIG. 3, both ends of each suspension board 100 in the Y direction are coupled to the support frame 510 by couplers 520. In the separation groove 526 between one side frame 511 and the suspension board 100 adjacent to the side frame 511, the inspection substrate 200 is coupled to the side frame 511 by the coupler 520. Similarly, in the separation groove 526 between another side frame 512 (FIG. 1) and the suspension board 100 adjacent to the side frame 512, the inspection substrate 200 is coupled to the side frame 512 by the coupler 520.

In this manner, in each rectangular region 521 to 525, the plurality of suspension boards 100 and the plurality of inspection substrates 200 are supported at the support frame 510 while being arranged in alignment. Therefore, it is possible to form a larger number of suspension boards 100 and inspection substrates 200 at the assembly sheet 500 without increasing the size of the support frame 510. Thus, a manufacturing cost of the assembly sheet 500 can be reduced. The couplers 520 are cut after the assembly sheet 500 is manufactured such that each suspension board 100 and each inspection substrate 200 are separated from the support frame 510.

(2) Configuration of Suspension Boards

Figure 4:
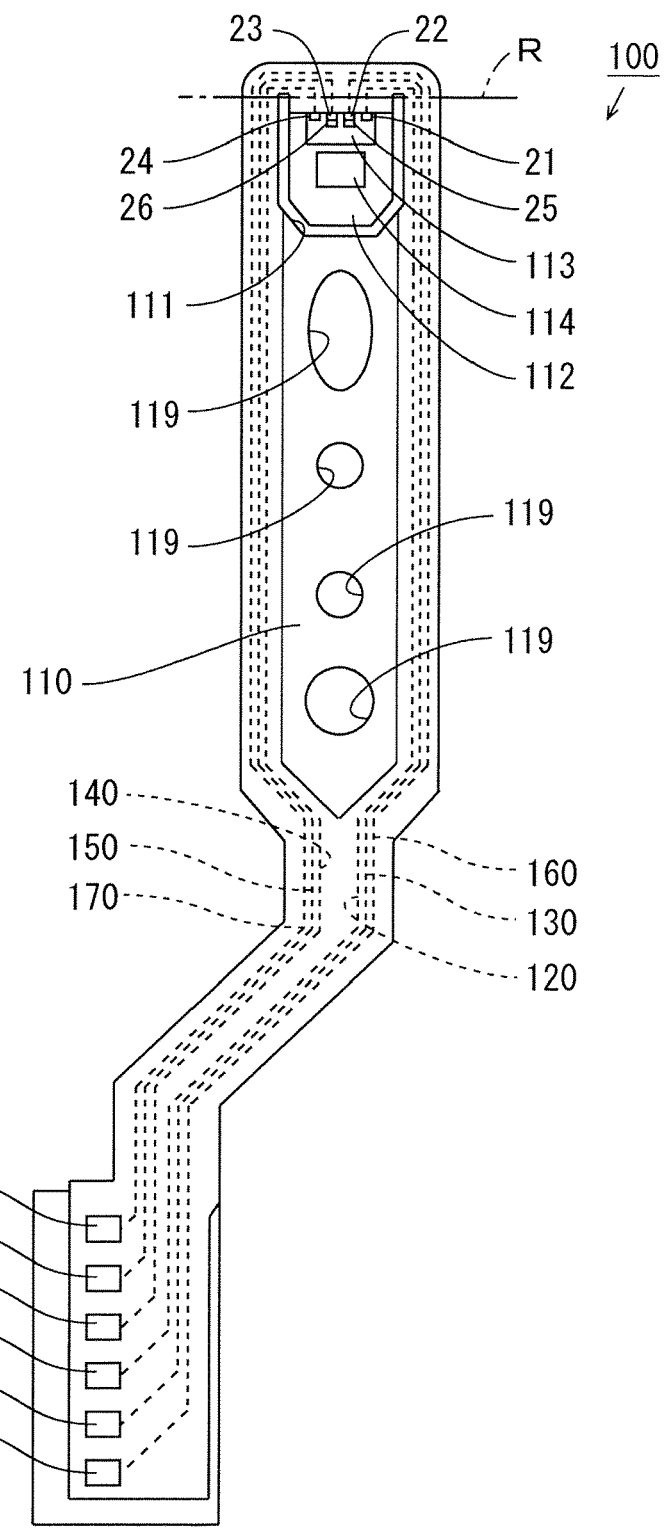
FIG. 4 is a top view of a suspension board of FIG. 1.

FIG. 4 is a top view of the suspension board 100 of FIG. 1. As shown in FIG. 4, the suspension board 100 includes a support substrate 110 formed of a metallic elongated substrate. Write wiring traces 120, 130, read wiring traces 140, 150 and element wiring traces 160, 170 are formed on the support substrate 110 as indicated by dotted lines. The write wiring trace 120 and the write wiring trace 130 constitute a signal line pair. Further, the read wiring trace 140 and the read wiring trace 150 constitute a signal line pair.

At the tip end of the support substrate 110, a slider supporting portion (hereinafter referred to as a tongue) 112 is provided by forming a U-shaped opening 111. The tongue 112 is bent along a one-dot and dash line R of FIG. 4 to form a predetermined angle with the support substrate 110. A rectangular opening 113 is formed at the end of the tongue 112, and six electrode pads 21, 22, 23, 24, 25, 26 are formed. Further, a base 114 is provided at a center portion of the tongue 112. Details of the configuration of the end portion of the tongue 112 and its peripheral portions will be described below.

Six electrode pads 31, 32, 33, 34, 35, 36 are formed at the other end of the support substrate 110. The electrode pads 21 to 26 on the tongue 112 and the electrode pads 31 to 36 at the other end of the support substrate 110 are respectively electrically connected to one another by the write wiring traces 120, 130, the read wiring traces 140, 150, and the element wiring traces 160, 170. Further, a plurality of holes 119 are formed in the support substrate 110.

FIG. 5 is a partially enlarged plan view of the suspension board 100 showing the slider being attached to the tongue 112 of FIG. 4. FIG. 6A is a cross sectional view taken along the line A-A of FIG. 5, and FIG. 6B is a cross sectional view taken along the line B-B of FIG. 5.

As shown in each of FIGS. 6A and 6B, the suspension board 100 according to the present embodiment has a configuration in which a first insulating layer 210, a second insulating layer 220 and a third insulating layer 230 are basically laminated on the support substrate 110 in this order. The write wiring traces 120, 130, the read wiring traces 140, 150, and the element wiring traces 160, 170 are formed on the upper surfaces of the first insulating layer 210 and the second insulating layer 220.

As shown in each of FIG. 5, and FIGS. 6A and 6B, at the end portion of the tongue 112, the rectangular opening 113 is formed at the support substrate 110. At the center portion of the tongue 112, the base 114 is formed by the laminated rectangular first insulating layer 210 and second insulating layer 220 on the support substrate 110. The slider 1 is attached to the upper surface of the base 114 using an adhesive or the like.

The slider 1 of the present example includes a slider main body 2. With the slider 1 being attached to the upper surface of the base 114, a tip end of the slider main body 2 and its vicinity are located above the opening 113. A magnetic head 6 is provided at the tip end of the slider main body 2. The magnetic head 6 has four connection terminals 6a. A light-emitting device 3 is provided to extend downward from a position in the vicinity of the tip end of the slider main body 2. The light-emitting device 3 has two connection terminals 3a. The two connection terminals 3a are located in the opening 113. An optical waveguide 4 and a near-field optical generation member (a near-field optical generator) 5 are provided inside of the slider main body 2. The optical waveguide 4 is located above the light-emitting device 3, and the near-field optical generation member 5 is located above the optical waveguide 4. Details of each constituent element of the slider 1 will be described below.

On the upper surface of the support substrate 110, the first insulating layer 210 is formed to cover a partial region of the opening 113 from the tip end of the suspension board 100. In the vicinity of the opening 113, the element wiring trace 160 is formed on the first insulating layer 210. The second insulating layer 220 is formed on the first insulating layer 210 to cover the element wiring trace 160. As shown in FIG. 6A, a plating layer 20 is formed at the tip end of the element wiring trace 160 at the line A-A of FIG. 5. Thus, the electrode pad 25 is formed. The electrode pad 25 is formed to project to a space above the opening 113 from a position between the first insulating layer 210 and the second insulating layer 220 and opposite to the light-emitting device 3 of the slider 1. The electrode pad 25 is connected to any of the two connection terminals 3a of the light-emitting device 3 using a solder 9.

Further, in the vicinity of the opening 113, the write wiring trace 120 and the write wiring trace 130 are formed on the second insulating layer 220. The third insulating layer 230 is formed on the second insulating layer 220 to cover part of each of the write wiring trace 120 and the write wiring trace 130. As shown in FIG. 6A, the plating layer 20 is formed at the tip end of the write wiring trace 130 at the A-A line of FIG. 5. Thus, the electrode pad 22 is formed. The electrode pad 22 is opposite to the magnetic head 6 and connected to any of the four connection terminals 6a of the magnetic head 6 using the solder 9. Further, as shown in FIG. 6B, the plating layer 20 is formed at the tip end of the write wiring trace 120 at the B-B line of FIG. 5. Thus, the electrode pad 21 is formed to be opposite to the magnetic head 6 of the slider 1. The electrode pad 21 is opposite to the magnetic head 6 and connected to any of the four connection terminals 6a of the magnetic head 6 using the solder 9.

As indicated by a thick two-dots and dash line in FIG. 5, a central line of the tongue 112 in parallel with a longitudinal direction of the suspension board 100 is referred to as an axis CA. In this case, in the vicinity of the opening 113, the element wiring trace 170, the read wiring trace 140 and the read wiring trace 150 are formed at positions symmetrical with the above-mentioned element wiring trace 160, the write wiring trace 120, and the write wiring trace 130 with respect to the axis CA, respectively.

Similarly to the element wiring trace 160, the element wiring trace 170 is formed on the first insulating layer 210. The electrode pad 26 is formed at the tip end of the element wiring trace 170. The electrode pad 26 has the configuration similar to the electrode pad 25, and is opposite to the light-emitting device 3 of the slider 1. The electrode pad 26 is connected to any of the two connection terminals 3a of the light-emitting device 3 using the solder 9. The read wiring trace 140 and the read wiring trace 150 are formed on the second insulating layer 220 similarly to the write wiring trace 120 and the write wiring trace 130. The electrode pads 24, 23, are respectively formed at the tip ends of the read wiring trace 140 and the read wiring trace 150. The electrode pads 23, 24 are respectively connected to any two of the four connection terminals 6a of the magnetic head 6 using the solder 9.

In the hard disc drive device (not shown) including the suspension board 100, a magnetic disc MD is arranged above the solider 1 as indicated by a two-dots and dash line in each of FIGS. 6A and 6B. At the time of writing information in the magnetic disc MD, a current flows through the pair of element wiring traces 160, 170. Thus, electric energy is supplied to the light-emitting device 3.

The light-emitting device 3 converts the supplied electric energy into optical energy, and generates light with high energy (laser light, for example). The generated light is guided to the near-field optical generation member 5 through the optical waveguide 4. The near-field optical generation member 5 converts the light guided from the optical waveguide 4 into near-field light and irradiates the magnetic disc MD with the near-field light. Thus, a small region of the magnetic disc MD is heated. In the magnetic disc MD, a coercive force of the portion heated by the near-field light locally is reduced. In this state, a current flows through the pair of write wiring traces 120, 130, so that a portion of which the coercive force is reduced in the magnetic disc MD is irradiated with a magnetic field from the magnetic head 6. The magnetic disc MD is irradiated with a relatively small magnetic field, so that information can be stably recorded in high density. Such a magnetic recording method is generally referred to as an optical assist magnetic recording method.

On the one hand, at the time of reading information from the magnetic disc MD, a current flows through the pair of read wiring traces 140, 150.

(3) Write Wiring Traces and Element Wiring Traces

Figure 7:
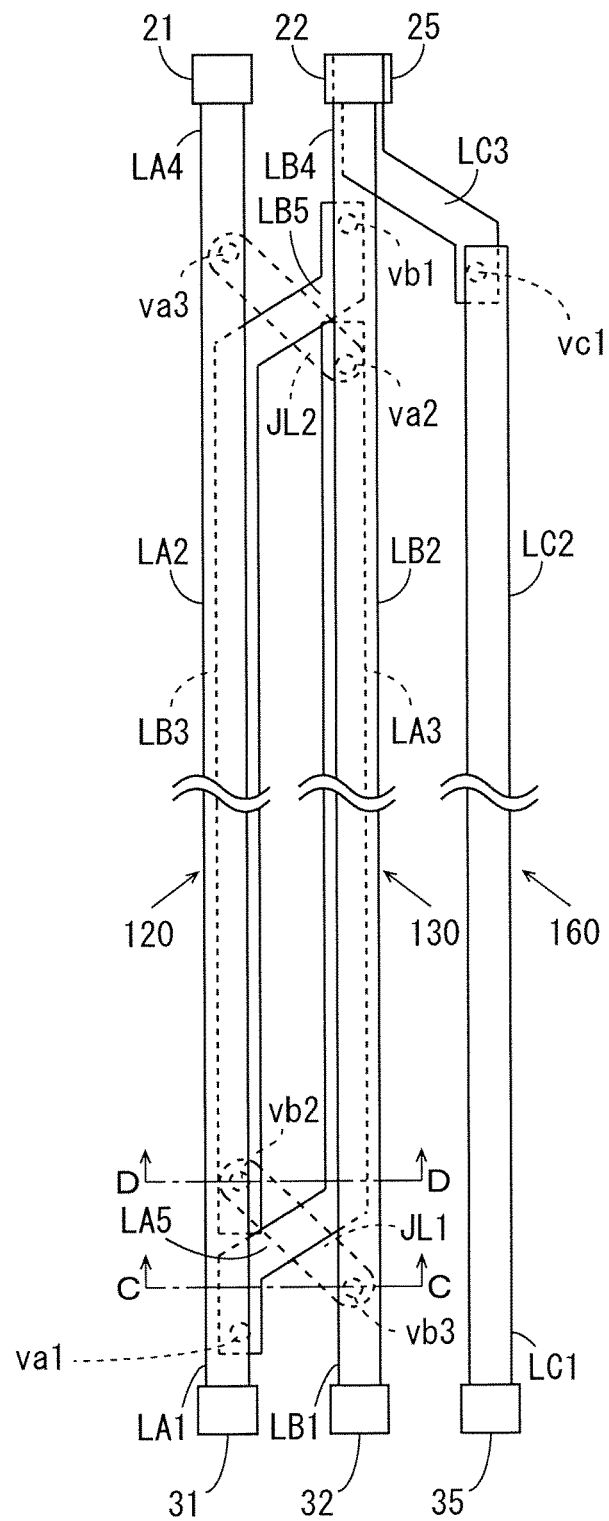
FIG. 7 is a schematic plan view for explaining the basic configuration of each of a write wiring trace and an element wiring trace.

Next, the detailed configuration of the write wiring traces 120, 130 and the element wiring trace 160 will be described. FIG. 7 is a schematic plan view for explaining the basic configuration of each of the write wiring traces 120, 130 and the element wiring trace 160, and FIG. 8 is a schematic perspective diagram for explaining the basic configuration of each of the write wiring traces 120, 130 and the element wiring trace 160 of FIG. 7.

In FIG. 7, the first insulating layer 210, the second insulating layer 220 and the third insulating layer 230 are not shown in order to facilitate understanding of the configuration of the write wiring traces 120, 130 and the element wiring trace 160. Further, in FIG. 8, the third insulating layer 230 is not shown, and the support substrate 110, the first insulating layer 210 and the second insulating layer 220 are indicated by one-dot and dash lines.

Figure 8:
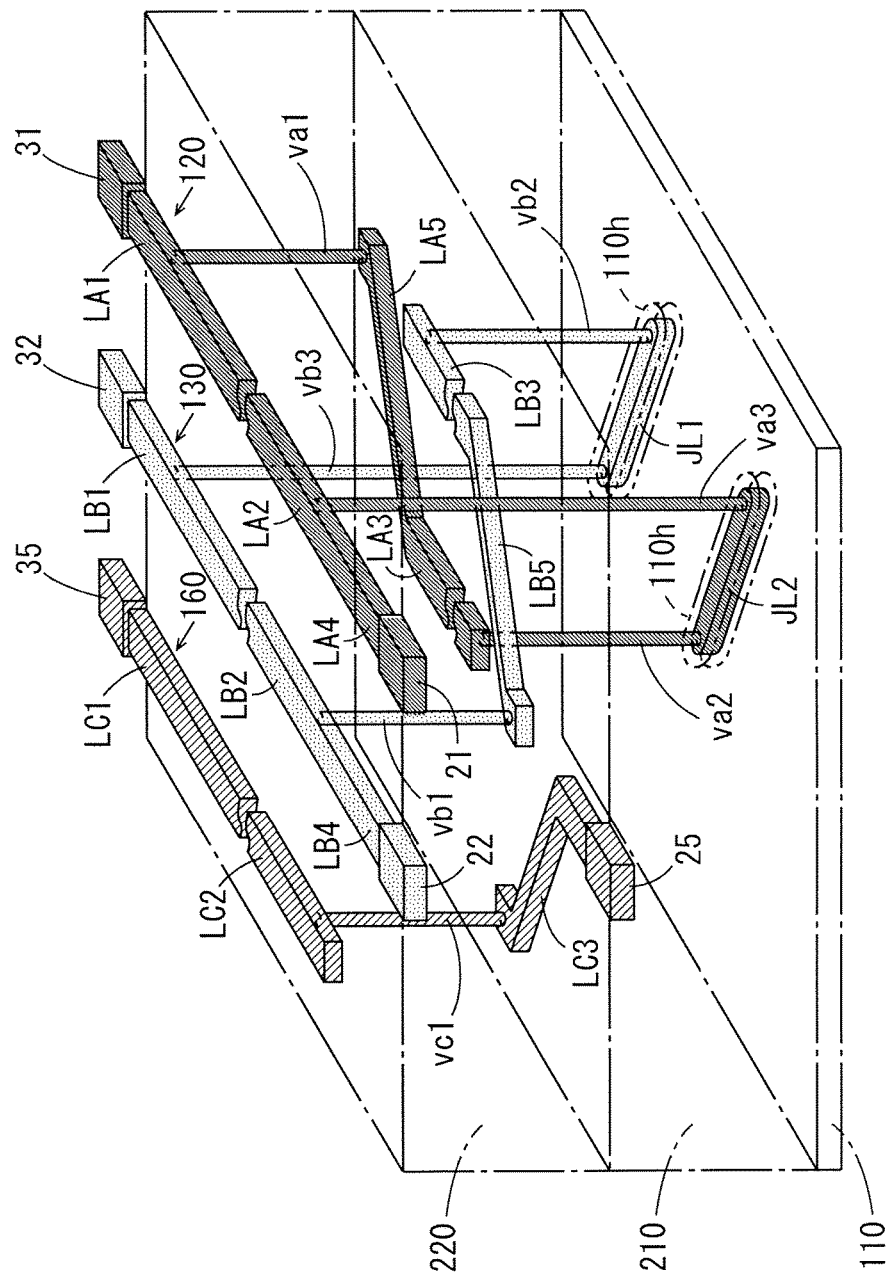
FIG. 8 is a schematic perspective view for explaining the basic configuration of each of the write wiring trace and the element wiring trace.

As shown in FIGS. 7 and 8, the write wiring trace 120 is mainly constituted by lines LA1 to LA5. The line LA2 of the lines LA1 to LA5 is sufficiently longer than the other lines LA1, LA3 to LA5. The write wiring trace 130 is mainly constituted by lines LB1 to LB5. The line LB2 of the lines LB1 to LB5 is sufficiently longer than the other lines LB1, LB3 to LB5. The element wiring trace 160 is mainly constituted by lines LC1 to LC3. The line LC2 of the lines LC1 to LC3 is sufficiently longer than the other lines LC1, LC3.

In FIG. 8, the write wiring trace 120 and constituent elements electrically connected to the write wiring trace 120 are indicated by dense hatching, and the write wiring trace 130 and constituent elements electrically connected to the write wiring trace 130 are indicated by a dotted pattern. Further, the element wiring trace 160 and constituent elements electrically connected to the element wiring trace 160 are indicated by sparse hatching.

As shown in FIG. 8, the lines LA3, LA5 of the write wiring trace 120, the lines LB3, LB5 of the write wiring trace 130 and the line LC3 of the element wiring trace 160 are formed on the upper surface of the first insulating layer 210. The second insulating layer 220 is formed on the upper surface of the first insulating layer 210 to cover the lines LA3, LA5, LB3, LB5, LC3.

Further, the lines LA1, LA2, LA4 of the write wiring trace 120, the lines LB1, LB2, LB4 of the write wiring trace 130, and the lines LC1, LC2 of the element wiring trace 160 are formed on the upper surface of the second insulating layer 220. The third insulating layer 230 (FIGS. 6A and 6B) is formed on the upper surface of the second insulating layer 220 to cover the lines LA1, LA2, LA4, LB1, LB2, LB4, LC1, LC2.

Jumper wires JL2, JL1 respectively corresponding to the write wiring traces 120, 130 are formed at the support substrate 110. Each jumper wire JL1, JL2 is constituted by part of the support substrate 110 and provided in an island-shape in an oval opening 110h of the support substrate 110. Each jumper wire JL1, JL2 is electrically separated from the rest of the support substrate 110.

As shown in FIGS. 7 and 8, the line LA2 of the write wiring trace 120, the line LB2 of the write wiring trace 130 and the line LC of the element wiring trace 160 are arranged in parallel with one another on the second insulating layer 220 at intervals. The line LA3 of the write wiring trace 120 and the line LB3 of the write wiring trace 130 are arranged in parallel with each other on the first insulating layer 210 at intervals. Further, the line LA3 of the write wiring trace 120 is located below the line LB2 of the write wiring trace 130, and the line LB3 of the write wiring trace 130 is located below the line LA2 of the write wiring trace 120.

As for the write wiring trace 120, one end of the line LA2 is integrated into one end of the line LA1, and the other end of the line LA2 is integrated into one end of the line LA4. The other end of the line LA1 is connected to the electrode pad 31, and the other end of the line LA4 is connected to the electrode pad 21. One end of the line LA5 is located below the one end of the line LA1, and the other end of the line LA5 is integrated into one end of the line LA3. One end of the jumper wire JL2 is located below the other end of the line LA3, and the other end of the jumper wire JL2 is located below the one end of the line LA4.

A via va1 is formed in the second insulating layer 220 to electrically connect the one end of the line LA5 to the one end of the line LA1. A via va2 is formed in the first insulating layer 210 to electrically connect the other end of the line LA3 to the one end of the jumper wire JL2. Further, a via va3 is formed in the first insulating layer 210 and the second insulating layer 220 to electrically connect the one end of the line LA4 to the other end of the jumper wire JL2. Thus, the electrode pads 21, 31 are electrically connected to each other through the lines LA1, LA2, LA4, and connected to each other through the lines LA1, LA3, LA4, LA5, the jumper wire JL2 and the vias va1, va2, va3.

As for the write wiring trace 130, one end of the line LB2 is integrated into one end of the line LB1, and the other end of the line LB2 is integrated into one end of the line LB4. The other end of the line LB1 is connected to the electrode pad 32, and the other end of the line LB4 is connected to the electrode pad 22. One end of the line LB5 is located below the one end of the line LB4, and the other end of the line LB5 is integrated into one end of the line LB3. The one end of the jumper wire JL1 is located below the other end of the line LB3, and the other end of the jumper wire JL1 is located below the one end of the line LB1.

A via vb1 is formed in the second insulating layer 220 to electrically connect the one end of the line LB5 to the one end of the line LB4. A via vb2 is formed in the first insulating layer 210 to electrically connect the other end of the line LB3 to the one end of the jumper wire JL1. Further, a via vb3 is formed in the first insulating layer 210 and the second insulating layer 220 to electrically connect the one end of the line LB1 to the other end of the jumper wire JL1. Thus, the electrode pads 21, 31 are electrically connected to each other through the lines LB1, LB2, LB4, and electrically connected to each other through the lines LB1, LB3, LB4, LB5, the jumper wire JL1 and the vias vb1, vb2, vb3.

As for the element wiring trace 160, one end of the line LC2 is integrated into one end of the line LC1. The other end of the line LC1 is connected to the electrode pad 35. One end of the line LC3 is located below the other end of the line LC2, and the other end of the line LC3 is connected to the electrode pad 25 at a position below the line LB4 of the write wiring trace 130. A via vc1 is formed in the second insulating layer 220 to electrically connect the other end of the line LC2 to the one end of the line LC3. Thus, the electrode pads 25, 35 are electrically connected to each other through the lines LC1, LC2, LC3 and the via vc1.

In the above-mentioned configuration, the line LA2 of the write wiring trace 120 is opposite to the line LB3 of the write wiring trace 130 with the second insulating layer 220 sandwiched therebetween. Further, the line LB2 of the write wiring trace 130 is opposite to the line LA3 of the write wiring trace 120 with the second insulating layer 220 sandwiched therebetween. Further, the line LA2 of the write wiring trace 120 and the line LB2 of the write wiring trace 130 are opposite to each other on the second insulating layer 220. Further, the line LA3 of the write wiring trace 120 and the line LB3 of the write wiring trace 130 are opposite to each other on the first insulating layer 210.

Thus, because a facing area between the write wiring trace 120 and the write wiring trace 130 increases, capacitance of the write wiring traces 120, 130 increases. As a result, characteristic impedance of the write wiring traces 120, 130 is reduced.

Further, the line LA2 of the write wiring trace 120 and the line LB3 of the write wiring trace 130 are arranged to overlap with each other with the second insulating layer 220 sandwiched therebetween, and the line LA3 of the write wiring trace 120 and the line LB2 of the write wiring trace 130 are arranged to overlap with each other with the second insulating layer 220 sandwiched therebetween. Thus, an occupied area by the lines LA2, LA3 of the write wiring trace 120 and the lines LB2, LB3 of the write wiring trace 130 is reduced.

Further, in the above-mentioned configuration, part of the line LC3 of the element wiring trace 160 is arranged below the line LB4 of the write wiring trace 130 with the second insulating layer 220 sandwiched therebetween. In this case, the height of the electrode pad 22 connected to the line LB4, and the height of the electrode pad 25 connected to the line LC3 can be different from each other. Thus, the slider 1 including the magnetic head 6 and the light-emitting device 3 can be provided at the suspension board 100.

The read wiring traces 140, 150 and the element wiring trace 170 basically have the same configuration as the above-mentioned write wiring traces 120, 130 and element wiring trace 160. Thus, similarly to the above-mentioned example, characteristic impedance of the read wiring traces 140, 150 can be reduced, and an occupied area of the read wiring traces 140, 150 can be reduced.

(4) Configuration of Inspection Substrates

Figure 9:
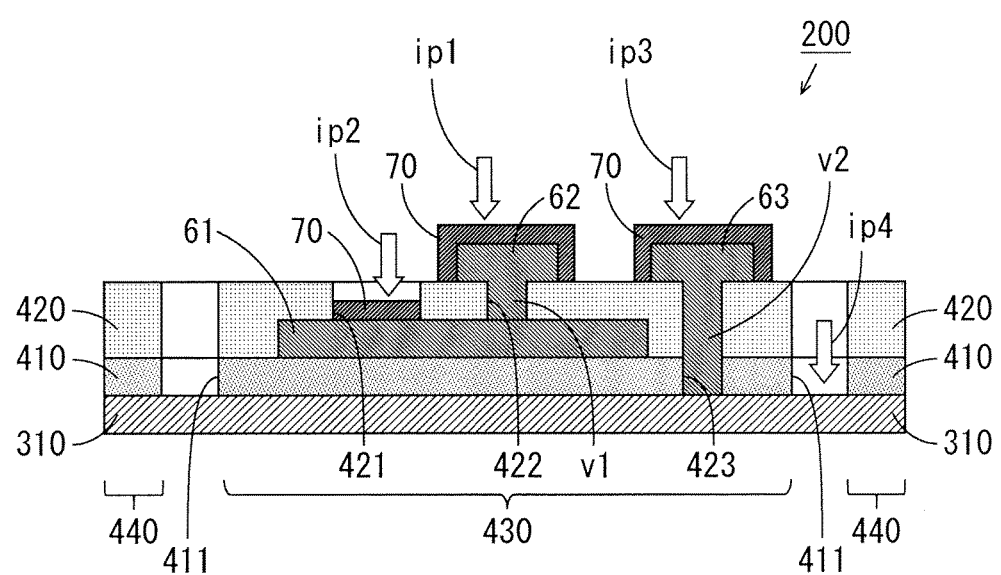
FIG. 9 is a longitudinal cross sectional view showing the basic configuration of an inspection substrate.
Figure 10A:
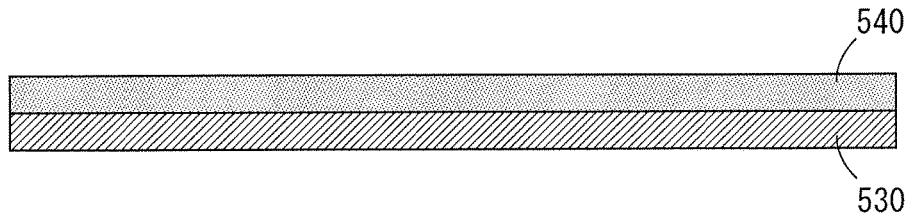
FIGS. 10A to 10D are cross sectional views showing a process of one example of a method of manufacturing the assembly sheet according to the first embodiment.
Figure 10B:
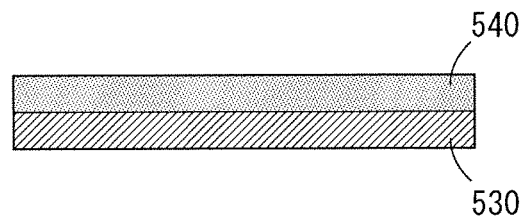
Figure 10C:
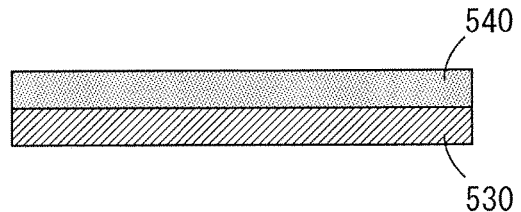
Figure 10D:
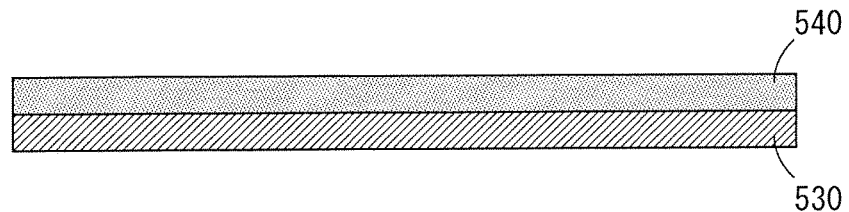

FIG. 9 is a longitudinal cross sectional view showing the basic configuration of the inspection substrate 200. As shown in FIG. 9, the inspection substrate 200 has a configuration in which a first insulating layer 410 and a second insulating layer 420 are basically laminated on a metallic support substrate 310 in this order. An annular opening 411 is formed in the first insulating layer 410 and the second insulating layer 420.

Thus, the first insulating layer 410 and the second insulating layer 420 are separated into an island-shape inner region 430 and an outer region 440 surrounding the inner region 430. The support substrate 310 is exposed upward from the opening 411 between the inner region 430 and the outer region 440.

In the inner region 430, an inspection conductor layer (a conductor layer for inspection) 61 having a predetermined shape is formed in part of a region on the first insulating layer 410. The second insulating layer 420 is formed on the first insulating layer 410 to cover the inspection conductor layer 61.

An opening 421 and a through hole 422 are formed in part of a region of the second insulating layer 420 covering the inspection conductor layer 61. Further, a through hole 423 continuously extending from the upper surface of the first insulating layer 410 to the lower surface of the second insulating layer 420 is formed in a region in which the inspection conductor layer 61 is not formed in the inner region 430.

An inspection conductor layer (a conductor layer for inspection) 62 having a predetermined shape is formed in part of a region that overlaps with the above-mentioned through hole 422 on the second insulating layer 420. A via v1 is formed by filling of the through hole 422 with a conductive material. Thus, the inspection conductor layer 62 is electrically connected to the inspection conductor layer 61 through the via v1. The above-mentioned via v1 in the inspection substrate 200 has the same configuration as the vias va1, vb1, vc1 of the suspension board 100 of FIG. 8.

Further, an inspection conductor layer (a conductor layer for inspection) 63 having a predetermined shape is formed in part of a region that overlaps with the above-mentioned through hole 423 to be spaced apart from the inspection conductor layer 62 on the second insulating layer 420. A via v2 is formed by filling of the through hole 423 with a conductive material. Thus, the inspection conductor layer 63 is electrically connected to the support substrate 310 through the via v2. The above-mentioned via v2 in the inspection substrate 200 has the same configuration as the vias va3, vb3 of the suspension board 100 of FIG. 8.

A plating layer 70 covering part of the inspection conductor layer 61 is formed in the opening 421 formed in the second insulating layer 420. Further, a plating layer 70 is formed to cover an outer surface of each of the inspection conductor layers 62, 63 formed on the second insulating layer 420. The plating layers 70 do not have to be formed.

As indicated by outlined arrows ip1, ip2 in FIG. 9, two probes of an inspection device are respectively brought into contact with the plating layer 70 covering the inspection conductor layer 61 and the plating layer 70 covering the inspection conductor layer 62. Thus, electric characteristics (a resistance value in the present example) of the via v1 can be measured.

In the opening 421 formed in the second insulating layer 420, the plating layer 70 is exposed upward as part of the inspection conductor layer 61. Thus, the probe of the inspection device can be easily brought into contact with the plating layer 70 exposed in the opening 421 (the inspection conductor layer 61 in the case where the plating 70 is not formed) from above the inspection substrate 200. Therefore, the electric characteristics of the via v1 can be inspected more efficiently and easily.

Further, as indicated by outlined arrows ip3, ip4 in FIG. 9, the two probes of the inspection device are respectively brought into contact with the plating layer 70 covering the inspection conductor layer 63 and the support substrate 310. Thus, the electric characteristics (a resistance value in the present example) of the via v2 can be measured.

Part of the support substrate 310 is exposed upward in the opening 411 formed in the first insulating layer 410 and the second insulating layer 420. Thus, the probe of the inspection device can be easily brought into contact with the support substrate 310 exposed in the opening 411. Therefore, the electric characteristics of the via v2 can be inspected more efficiently and easily.

The above-mentioned inspection substrate 200 is formed inside of the product guarantee region 550 of the assembly sheet 500 of FIG. 2. At least, the vias v1, v2 of the inspection substrate 200 are formed inside of the product guarantee region 550 of the assembly sheet 500.

(5) Method of Manufacturing Assembly Sheet

Next, the method of manufacturing the assembly sheet 500 will be described. In the present example, a plurality of assembly sheets 500 are formed by a roll-to-roll system on the elongated support substrate. FIGS. 10A to 19D are cross sectional views showing the process of one example of the method of manufacturing the assembly sheet 500 according to the first embodiment. In FIGS. 10A to 19D, each of FIGS. 10A, 11A, 12A, 13A, 14A, 15A, 16A, 17A, 18A and 19A corresponds to a cross sectional view taken along the line A-A of FIG. 5, each of FIGS. 10B, 11B, 12B, 13B, 14B, 15B, 16B, 17B, 18B and 19B corresponds to a cross sectional view taken along the line C-C of FIG. 7, each of FIGS. 10O, 11O, 12C, 13C, 14C, 15C, 16C, 17C, 18C and 19C corresponds to a cross sectional view taken along the line D-D of FIG. 7, and each of FIGS. 10D, 11D, 12D, 13D, 14D, 15D, 16D, 17D, 18D and 19D corresponds to a longitudinal cross section of the inspection substrate 200 of FIG. 9.

In the method of manufacturing the assembly sheet 500, the formation process for each of the write wiring traces 120, 130 and the element wiring trace 160 is basically the same as the formation process for each of the read wiring traces 140, 150, and the element wiring trace 170. Therefore, in the below-mentioned description, the formation process for each of the write wiring traces 140, 150 and the element wiring trace 170 is not described.

First, as shown in FIGS. 10A to 10D, a base insulating layer 540 made of polyimide is formed on an elongated support substrate 530 made of stainless steel. A two-layer base material having a laminated structure of the suspension board 530 and the base insulating layer 540 may be used.

The material for the support substrate 530 is not limited to stainless steel, and another metal material such as aluminum (Al) may be used. The thickness of the support substrate 530 is not less than 10 μm and not more than 30 μm, for example, and is preferably not less than 12 μm and not more than 20 μm. The material for the base insulating layer 540 is not limited to polyimide, and another resin material such as epoxy may be used. The thickness of the base insulating layer 540 is not less than 3 μm and not more than 20 μm, for example, and is preferably not less than 5 μm and not more than 15 μm.

Figure 11A:
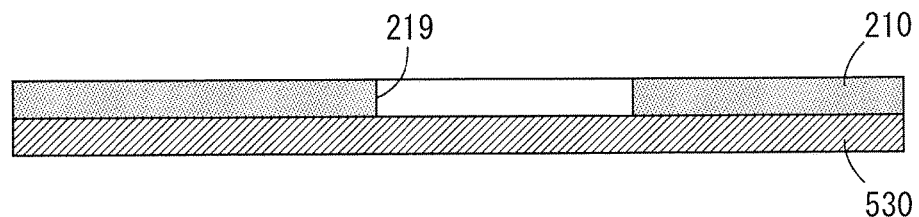
FIGS. 11A to 11D are cross sectional views showing a process of the one example of the method of manufacturing the assembly sheet according to the first embodiment.
Figure 11B:
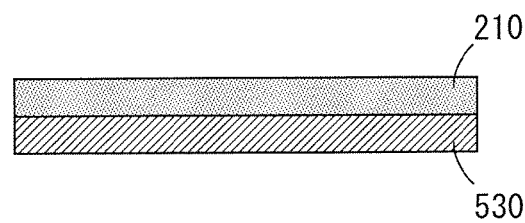
Figure 11C:
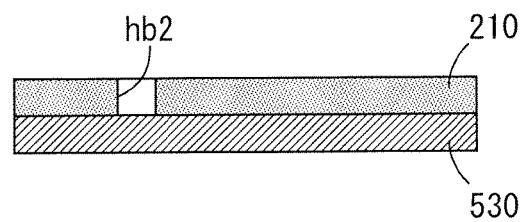
Figure 11D:
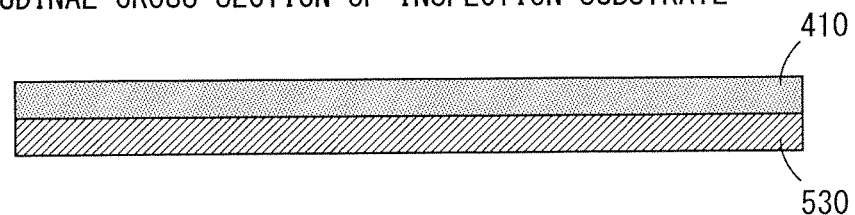

Next, as shown in FIGS. 11A to 11D, the first insulating layer 210 for the suspension board 100 and the first insulating layer 410 for the inspection board 200 are formed by etching of the base insulating layer 540, for example. At this time, as shown in FIG. 11A, an opening 219 is formed in a region except for the base 114 of FIG. 5 in the portion corresponding to the tongue 112 of FIG. 5. Further, as shown in FIG. 11C, in the first insulating layer 210, a through hole hb2 for the via vb2 of FIG. 8 is formed, and a through hole (not shown) for the via va2 of FIG. 8 is formed.

Figure 12A:
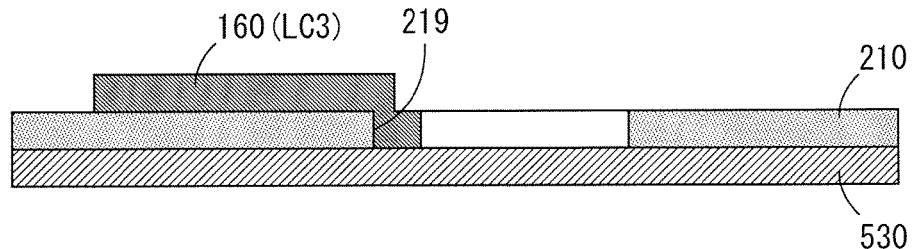
FIGS. 12A to 12D are cross sectional views showing a process of the one example of the method of manufacturing the assembly sheet according to the first embodiment.
Figure 12B:
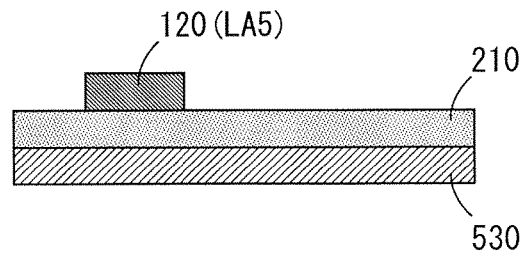
Figure 12C:
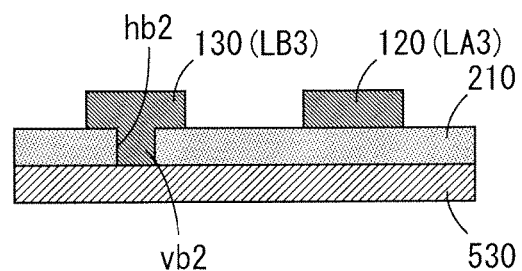
Figure 12D:
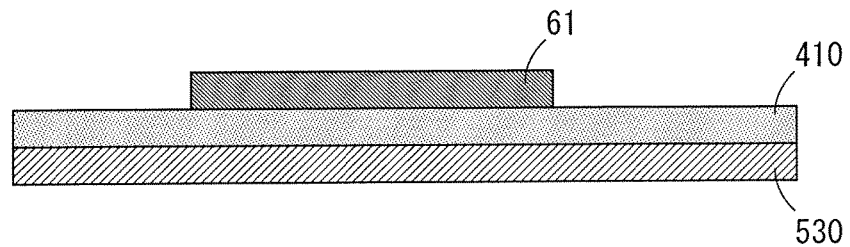

Next, as shown in FIGS. 12A to 12C, part of each of the write wiring traces 120, 130 of FIG. 4 and part of the element wiring trace 160 that are made of copper are formed on the first insulating layer 210 by an electrolytic plating method or the like. Further, as shown in FIG. 12D, the inspection conductor layer 61 of FIG. 9 made of copper is formed on the first insulating layer 410.

Specifically, the lines LA3, LA5 of the write wiring trace 120 of FIG. 8, the lines LB3, LB5 of the write wiring trace 130 and the line LC3 of the element wiring trace 160 of FIG. 8 are formed on the first insulating layer 210. At this time, as shown in FIG. 12C, a conductive material made of copper, for example, is filled in the through hole hb2 for the via vb2 of FIG. 8. Thus, the via vb2 of FIG. 8 is formed. Further, a conductive material is also is filled in a through hole (not shown) for the via va2 of FIG. 8. Thus, the via va2 of FIG. 8 is formed.

Figure 13A:
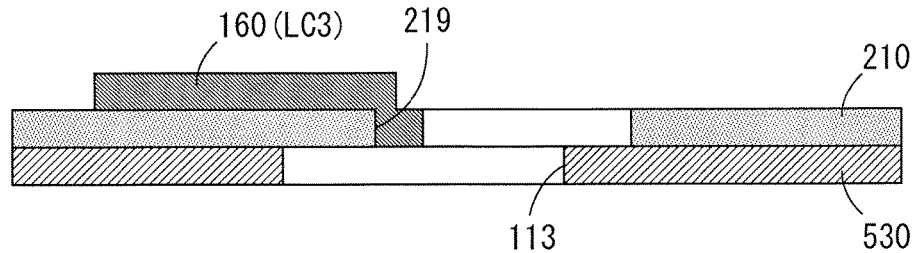
FIGS. 13A to 13D are cross sectional views showing a process of the one example of the method of manufacturing the assembly sheet according to the first embodiment.
Figure 13B:
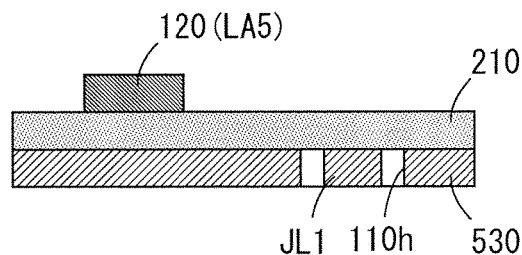
Figure 13C:
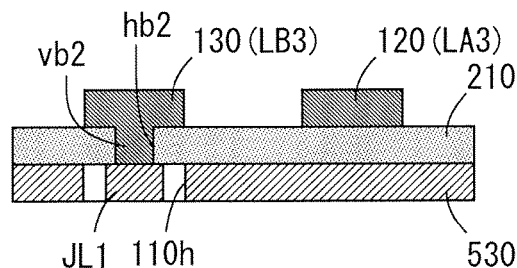

Next, as shown in FIGS. 13A to 13C, openings are formed in part of the support substrate 530 by etching or the like. Specifically, as shown in FIG. 13A, the opening 113 of FIG.

Figure 13D:
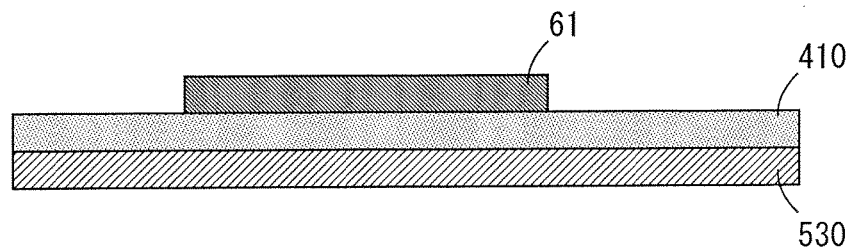

5 is formed in the support substrate 530. Further, the opening 111 and the plurality of holes 119 of FIG. 4 are formed in the support substrate 530. Further, the two openings 110h of FIG. 8 are formed in the support substrate 530. Thus, as shown in FIGS. 13B and 13C, the island-shape jumper wire JL1 is formed in the one opening 110h. In this state, the line LB3 of the write wiring trace 130 and the jumper wire JL1 are electrically connected to each other through the via vb2 (see FIG. 8). Further, the island-shape jumper wire JL2 is formed in the other opening 110h. In this state, the line LA3 of the write wiring trace 120 and the jumper wire JL2 are electrically connected to each other through the via va2 (see FIG. 8). As shown in FIG. 13D, an opening is not formed in the portion of the support substrate 530 corresponding to the inspection substrate 200 in the present example.

Figure 14A:
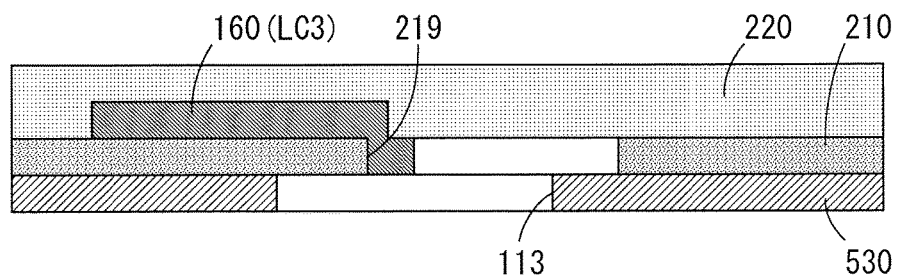
FIGS. 14A to 14D are cross sectional views showing a process of the one example of the method of manufacturing the assembly sheet according to the first embodiment.
Figure 14B:
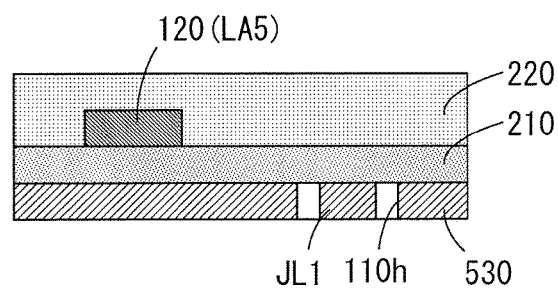
Figure 14C:
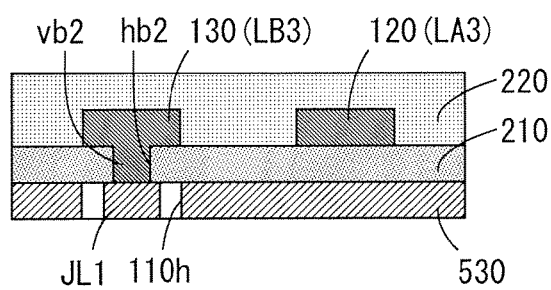
Figure 14D:
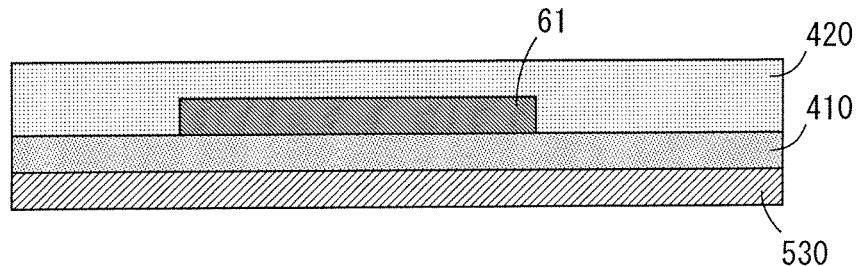

Next, as shown in FIGS. 14A to 14C, the second insulating layer 220 made of polyimide is formed on the first insulating layer 210 to cover the lines LA3, LA5 of the write wiring trace 120 of FIG. 8, the lines LB3, LB5 of the write wiring trace 130 of FIG. 8, and the line LC3 of the element wiring trace 160 of FIG. 8. Further, as shown in FIG. 14D, the second insulating layer 420 made of polyimide is formed on the first insulating layer 410 to cover the inspection conductor layer 61. A material for the second insulating layers 220, 420 is not limited to polyimide, and another resist material such as epoxy may be used. The thickness of each of the second insulating layers 220, 420 is not less than 3 μm and not more than 20 μm, for example, and is preferably not less than 5 μm and not more than 15 μm.

Then, as shown in FIGS. 15A to 15D, parts of each of the first insulating layers 210, 410 and second insulating layers 220, 420 are removed by etching of the second insulating layer 220, for example.

Figure 15A:
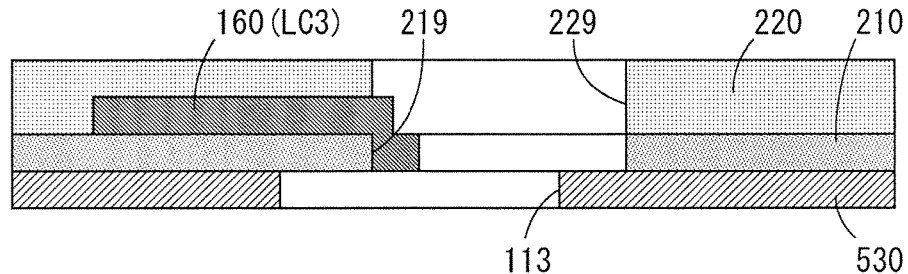
FIGS. 15A to 15D are cross sectional views showing a process of the one example of the method of manufacturing the assembly sheet according to the first embodiment.

Specifically, as shown in FIG. 15A, an opening 229 is formed in the second insulating layer 220 above the opening 219 of the first insulating layer 210. In this state, a space in the opening 113 of the support substrate 530 and spaces in the openings 219, 229 communicate with one another. Further, the tip end of the element wiring trace 160 is exposed in these spaces.

Figure 15B:
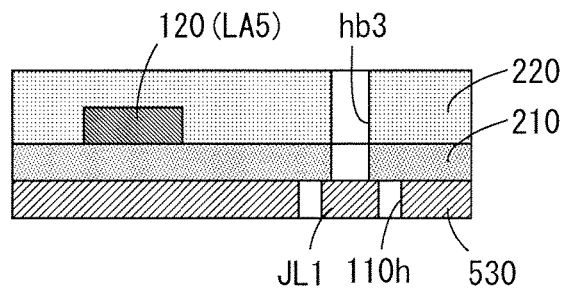
Figure 15C:
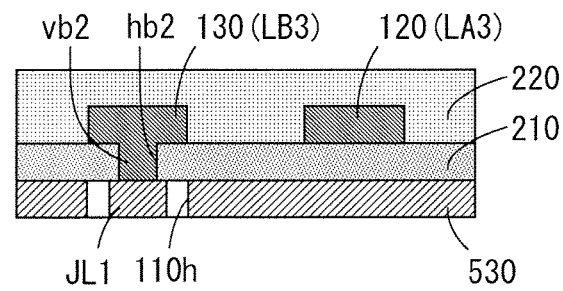

Further, as shown in FIG. 15B, a through hole hb3 for the via vb3 of FIG. 8 is formed, and a through hole (not shown) for the via va3 of FIG. 8 is formed in the first insulating layer 210 and the second insulating layer 220. Through holes (not shown) for the vias va1, vb1, vc1 of FIG. 8 are formed in the second insulating layer 220.

Figure 15D:
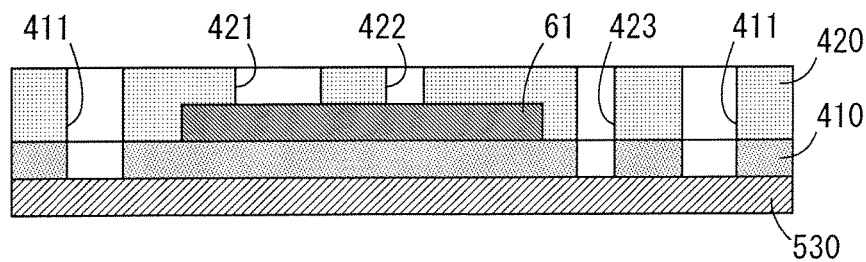

Further, as shown in FIG. 15D, the opening 411 of FIG. 9 and the through hole 423 of FIG. 9 are formed in the first insulating layer 410 and the second insulating layer 420. The opening 421 of FIG. 9 and the through hole 422 of FIG. 9 are formed in the second insulating layer 420.

Figure 16A:
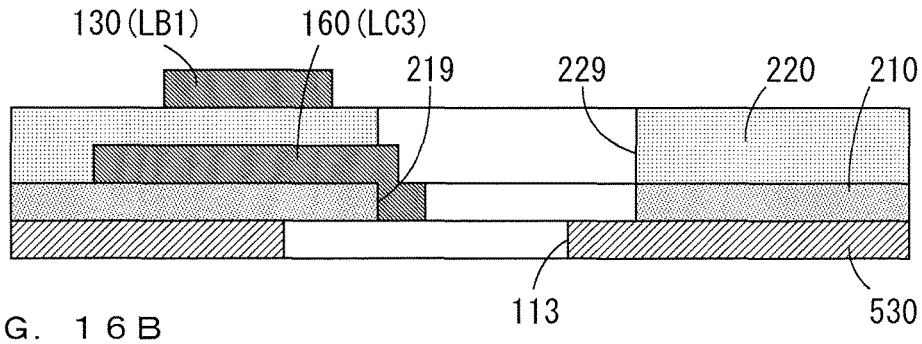
FIGS. 16A to 16D are cross sectional views showing a process of the one example of the method of manufacturing the assembly sheet according to the first embodiment.
Figure 16B:
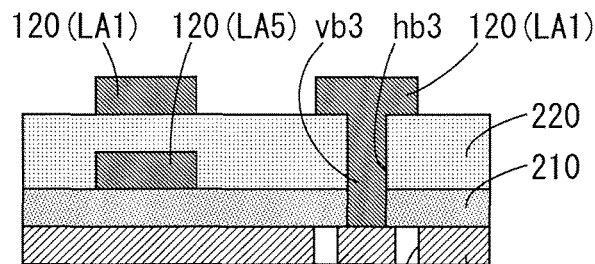
Figure 16C:
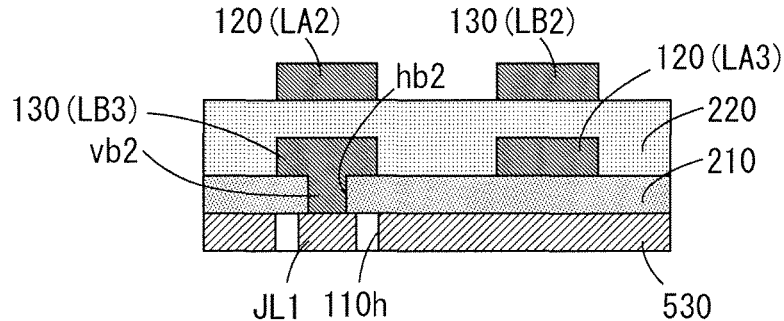
Figure 16D:
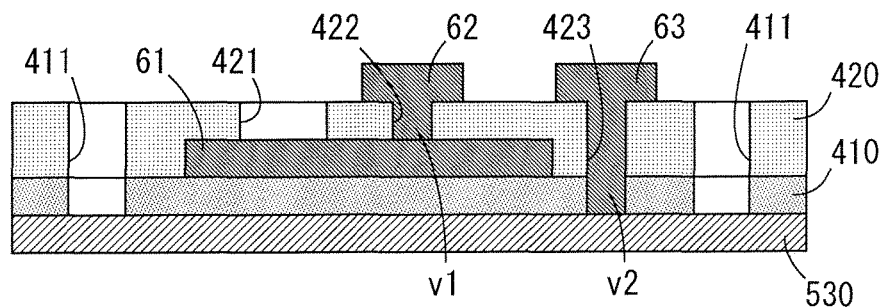

Next, as shown in FIGS. 16A to 16C, remaining portions of the write wiring traces 120, 130 and element wiring trace 160 of FIG. 4 that are made of copper are formed on the second insulating layer 220 by the electrolytic plating method. Further, as shown in FIG. 16D, the inspection conductor layers 62, 63 of FIG. 9 made of copper are formed on the second insulating layer 420.

Specifically, the lines LA1, LA2, LA4 of the write wiring trace 120 of FIG. 8, the lines LB1, LB2, LB4 of the write wiring trace 130 of FIG. 8, and the lines LC1, LC2 of the element wiring trace 160 of FIG. 8 are formed on the second insulating layer 220. At this time, as shown in FIG. 16B, a conductive material is filled in the through hole hb3 for the via vb3 of FIG. 8. Thus, the via vb3 of FIG. 8 is formed. Further, a conductive material is filled in the respective through holes (not shown) for the vias va1, vb1, vc1, va3 of FIG. 8. Thus, the vias va1, vb1, vc1, va3 of FIG. 8 are respectively formed.

Further, as described above, when the inspection conductor layer 62 is formed on the second insulating layer 420, a conductive material is filled in the through hole 422. Thus, the via v1 of FIG. 9 is formed. When the inspection conductor layer 63 is formed on the second insulating layer 420, a conductive material is filled in the through hole 423. Thus, the via v2 of FIG. 9 is formed.

Figure 17A:
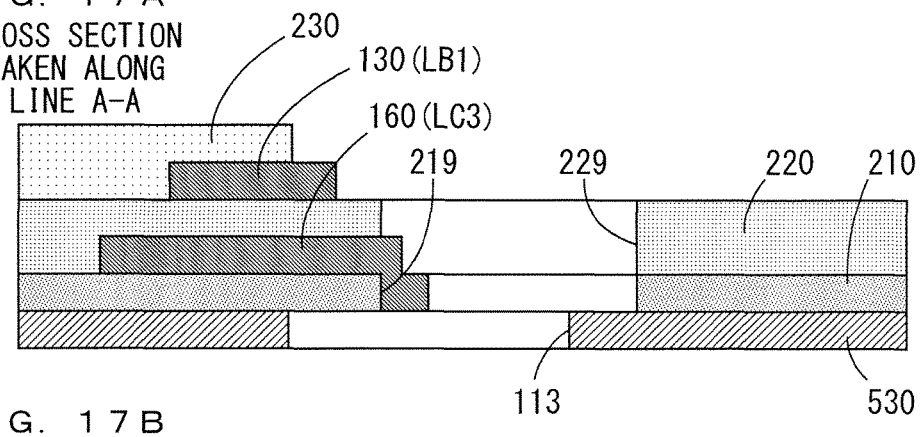
FIGS. 17A to 17D are cross sectional views showing a process of the one example of the method of manufacturing the assembly sheet according to the first embodiment.
Figure 17B:
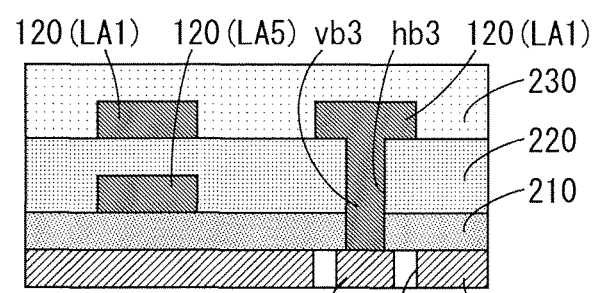
Figure 17C:
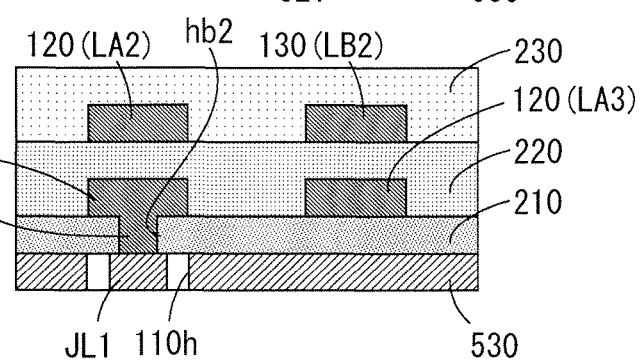
Figure 17D:
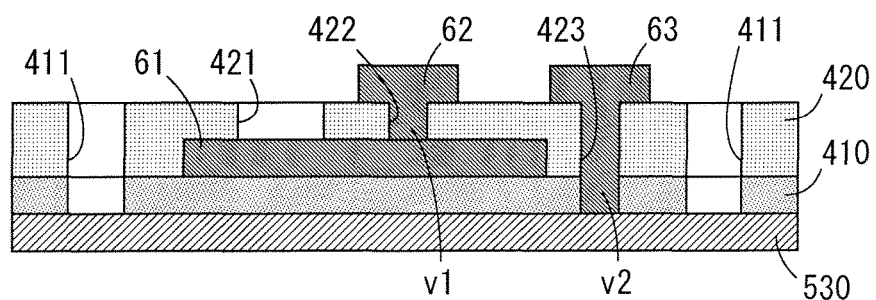

Then, as shown in FIGS. 17A to 17C, the third insulating layer 230 made of polyimide is formed on the second insulating layer 220 to cover portions except for the both ends of each of the write wiring traces 120, 130 and the element wiring trace 160. The third insulating layer 230 functions as an insulating layer for protecting wires. As shown in FIG. 17D, an insulating layer is not formed on the second insulating layer 420 in the present example. An insulating layer equivalent to the above-mentioned third insulating layer 230 may be formed on the second insulating layer 420 to cover part of each of the inspection conductor layers 62, 63. A material for the third insulating layer 230 is not limited to polyimide, and another resin material such as epoxy may be used. The thickness of the third insulating layer 230 is not less than 3 μm and not more than 20 μm, for example, and is preferably not less than 5 μm and not more than 15 μm.

Figure 18A:
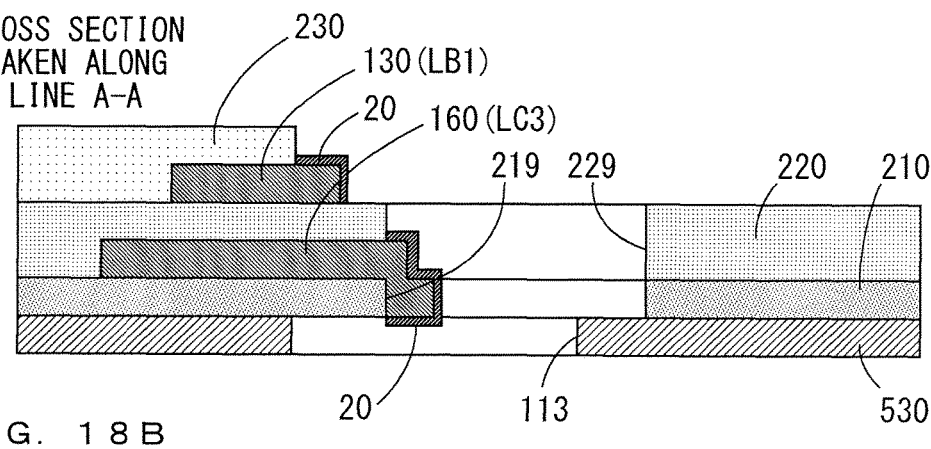
FIGS. 18A to 18D are cross sectional views showing a process of the one example of the method of manufacturing the assembly sheet according to the first embodiment.
Figure 18B:
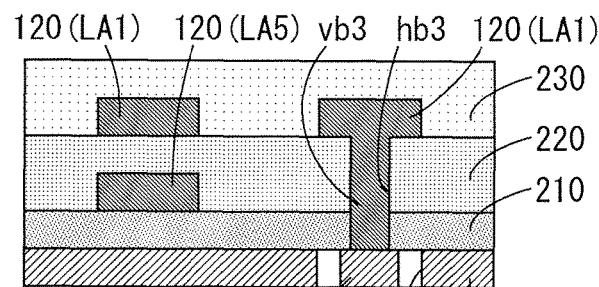
Figure 18C:
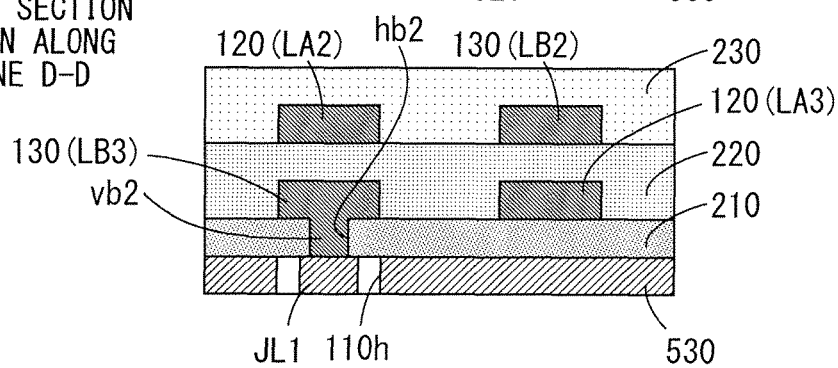

Then, as shown in FIG. 18A, a plating layer 20 is formed on the outer surfaces of the both ends of each of the write wiring traces 120, 130 and the element wiring trace 160 exposed to the outside from any of a portion between the first insulating layer 210 and the second insulating layer 220, and a portion between the second insulating layer 220 and the third insulating layer 230. Thus, the above-mentioned electrode pads 21, 22, 25, 31, 32, 35 are formed at the both ends of each of the write wiring traces 120, 130 and the element wiring trace 160 on which the plating layers 20 are formed. The plating layer 20 is made of a gold plating layer, for example. Alternatively, the plating layer 20 has the configuration in which a nickel plating layer and a gold plating layer, for example, are laminated in this order.

Figure 18D:
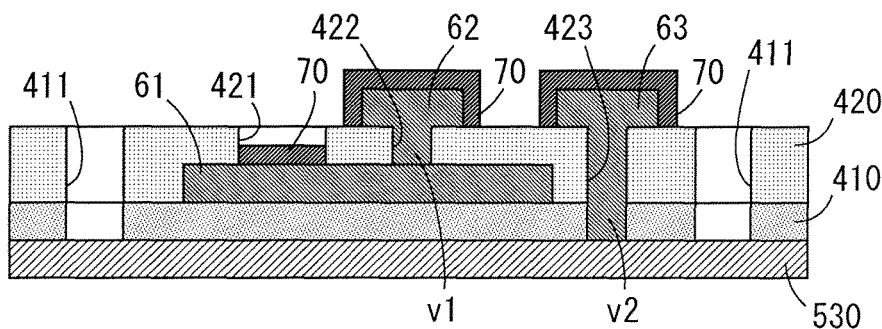
Figure 20A:
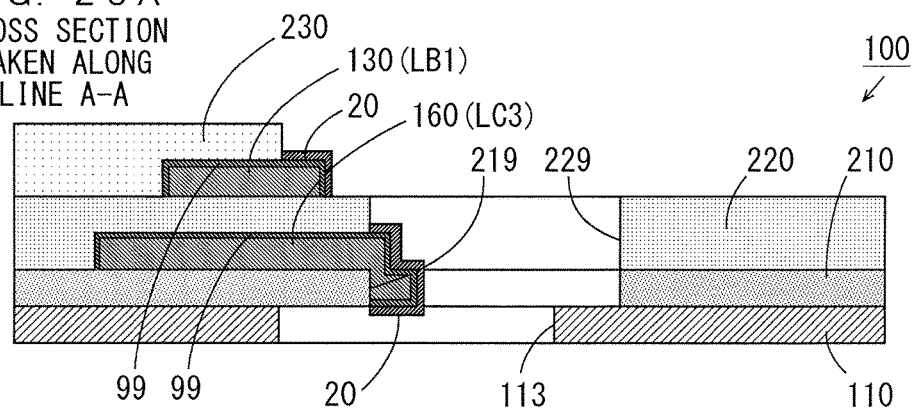
FIGS. 20A to 20D are cross sectional views of a plurality of portions of the assembly sheet showing a nickel plating layer being formed on an outer surface of each of the write wiring trace, the element wiring trace, and an inspection conductor layer.
Figure 20B:
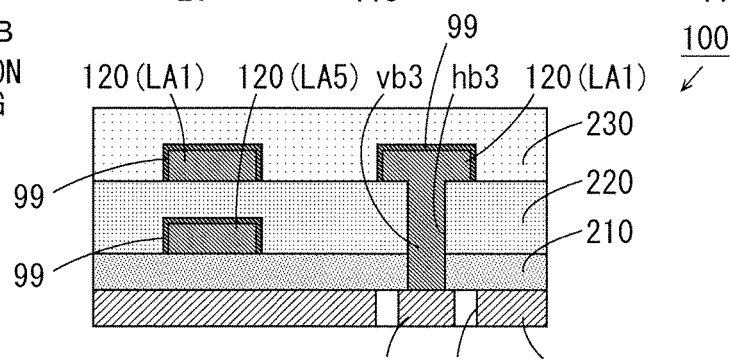
Figure 20C:
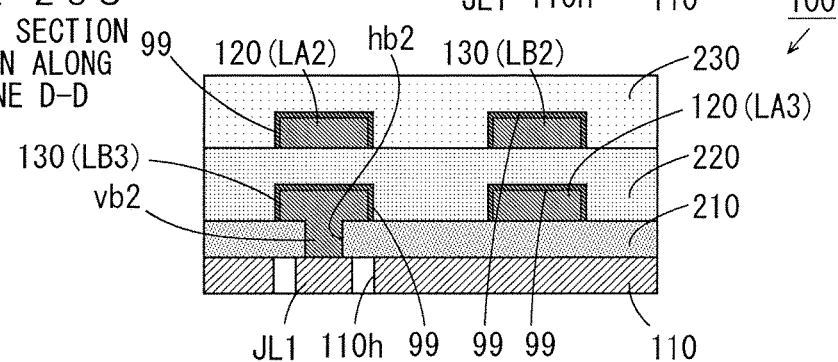
Figure 20D:
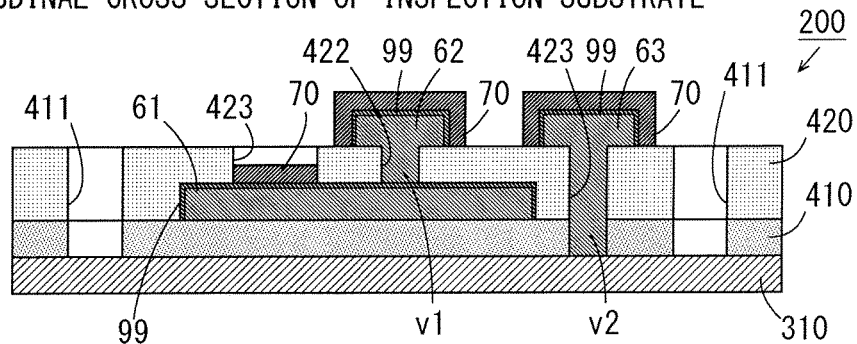

Further, as shown in FIG. 18D, a plating layer 70 covering part of the inspection conductor layer 61 is formed in the opening 421 of the second insulating layer 420. Further, a plating layer 70 is formed to cover an outer surface of each of the inspection conductor layers 62, 63. The configuration of the plating layer 70 is the same as the above-mentioned plating layer 20. Further, the plating layer 70 is formed by the same method as the plating layer 20.

Subsequently, the separation grooves 526 of FIG. 1 are formed at the support substrate 530 by etching of the support substrate 530, for example. Further, an individual assembly sheet 500 is separated by cutting of the elongated support substrate 530 at constant intervals.

Thus, as shown in FIGS. 19A to 19D, the support substrate 110 for the suspension board 100, the support substrate 310 for the inspection substrate 200, the support frame 510 and the couplers 520 of FIG. 3 are formed.

The assembly sheet 500 including the plurality of suspension boards 100, the plurality of inspection substrates 200 and the support frame 510 is completed by the above-mentioned process.

In the above-mentioned manufacturing method, the write wiring traces 120, 130, the read wiring traces 140, 150, the element wiring traces 160, 170, the inspection conductor layers 61, 62, 63 may be formed using an additive method, may be formed using a semi-additive method, or may be formed by using another method such as a subtractive method.

The material for the write wiring traces 120, 130, the read wiring traces 140, 150, the element wiring traces 160, 170, the inspection conductor layers 61, 62, 63 is not limited to copper, and may be another metal such as gold (Au) or aluminum or an alloy such as a copper alloy or an aluminum alloy. The thickness of each of the write wiring traces 120, 130, the read wiring traces 140, 150, the element wiring traces 160, 170, and the inspection conductor layers 61, 62, 63 is not less than 3 µm and not more than 16 µm, for example, and is preferably not less than 6 µm and not more than 13 µm. The width of each of the write wiring traces 120, 130 and the read wiring traces 140, 150 is not less than 12 µm and not more than 60 µm, for example, and is preferably not less than 16 µm and not more than 50 µm.

In the above-mentioned manufacturing method, a nickel plating layer, for example, may be formed on the outer surface of each of the write wiring traces 120, 130 and the read wiring traces 140, 150, and the element wiring traces 160, 170. Specifically, in a period after the process of FIGS. 13A to 13D and before the process of FIGS. 14A to 14D, a nickel plating layer may be formed on the exposed outer surface of each of the write wiring traces 120, 130, the element wiring trace 160 and the inspection conductor layer 61. Further, in a period after the process of FIGS. 16A to 16D and before the process of FIGS. 17A to 17D, a nickel plating layer may be formed on the exposed outer surface of each of the write wiring traces 120, 130, the element wiring trace 160 and the inspection conductor layers 62, 63. In the present example, the formation of the nickel plating layer is performed by an electroless plating method.

FIGS. 20A to 20D are cross sectional views of a plurality of portions of the assembly sheet 500 showing a nickel plating layer being formed on the outer surface of each of the write wiring traces 120, 130, the element wiring trace 160 and the inspection conductor layer 61. In FIGS. 20A to 20D, FIG. 20A corresponds to a cross sectional view taken along the line A-A of FIG. 5, FIG. 20B corresponds to a cross sectional view taken along the line C-C of FIG. 7, FIG. 20C corresponds to a cross sectional view taken along the line D-D of FIG. 7, and FIG. 7D corresponds to a longitudinal cross section of the inspection substrate 200 of FIG. 9.

In the example of FIGS. 20A to 20D, the outer surface of each of the write wiring traces 120, 130 and the element wiring trace 160 comes into contact with the second insulating layer 220 or the third insulating layer 230 with the nickel plating layer 99 sandwiched therebetween. Thus, adhesion between the outer surface of each of the write wiring traces 120, 130 and the element wiring trace 160, and the second insulating layer 220 or the third insulating layer 230 is improved. Further, the outer surface of the inspection conductor layer 61 and the second insulating layer 420 come into contact with each other with the nickel plating layer 99 sandwiched therebetween. Thus, adhesion between the outer surface of the inspection conductor layer 61 and the second insulating layer 420 is improved.

Further, in the above-mentioned manufacturing method, a diameter of each of the plurality of through holes (only the through holes hb2, hb3, 422, 423 are shown in FIGS. 15A to 18D) for the plurality of vias va1, va2, va3, vb1, vb2, vb3, vc1, v1, v2 is not less than 20 µm and not more than 200 µm, for example, and is preferably not less than 40 µm and not more than 100 µm.

(6) Inspection and Effects of Inspection Substrate

In the assembly sheet 500 according to the present embodiment, the plurality of suspension boards 100 and the inspection substrates 200 are integrally supported by the support frame 510.

As for each inspection substrate 200 of the assembly sheet 500, as described above, the two probes of the inspection device are respectively brought into contact with the plating layer 70 covering the inspection conductor layer 61 and the plating layer 70 covering the inspection conductor layer 62, whereby a resistance value of the via v1 (FIG. 9) is measured. The via v1 passing through the second insulating layer 420 has the same configuration as the vias va1, vb1, vc1 (FIG. 8) passing through the second insulating layer 220. Therefore, a resistance value of the via v1 of each inspection substrate 200 and a resistance value of each of the vias va1, vb1, vc1 of each suspension board 100 have a high correlation. Therefore, whether the electric characteristics of each of the vias va1, vb1, vc1 of the plurality of suspension boards 100 are good can be inspected by measurement of the resistance value of the via v1 of the inspection substrate 200.

Further, as for each inspection substrate 200, as described above, the two probes of the inspection device are respectively brought into contact with the plating layer 70 covering the inspection conductor layer 63 and the support substrate 310, whereby a resistance value of the via v2 (FIG. 9) is measured. The via v2 passing through the first insulating layer 410 and the second insulating layer 420 has the same configuration as each of the vias va3, vb3 (FIG. 8) passing through the first insulating layer 210 and the second insulating layer 220. Therefore, a resistance value of the via v2 of each inspection substrate 200 and a resistance value of each of the vias va3, vb3 of each suspension board 100 have a high correlation. Therefore, whether the electric characteristics of each of the vias va3, vb3 of the plurality of suspension boards 100 are good can be inspected by measurement of the resistance value of the via v2 of the inspection substrate 200.

As a result, the inspection for the vias va1, va3, vb1, vb3, vc1 of the plurality of suspension boards 100 can be performed in a short period of time, and reliability of the result of inspection can be improved.

The plurality of couplers 520 of the assembly sheet 500 are cut after the inspection, whereby the plurality of suspension boards 100 and the plurality of inspection substrates 200 can be separated from the support frame 510. The plurality of inspection substrates 200 do not have to be separated from the assembly sheet 500, or may be separated from the assembly sheet 500. The inspection for each of the vias v1, v2 of the inspection substrates 200 may be performed after the inspection substrate 200 is separated from the assembly sheet 500.

In the present embodiment, the inspection for each of the vias v1, v2 of the inspection substrate 200 formed in each of the rectangular regions 521 to 525 of the assembly sheet 500 is performed, whereby reliability of the result of inspection for each of the vias va1, va3, vb1, vb3, vc1 of each of the plurality of suspension boards 100 formed in the corresponding rectangular region can be more sufficiently improved.

[2] Second Embodiment

Figure 21:
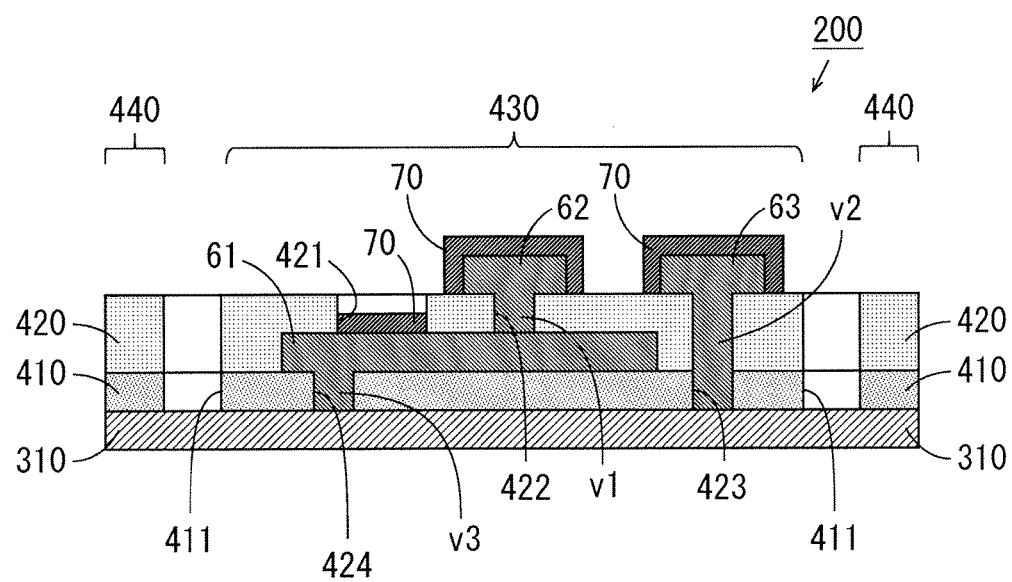
FIG. 21 is a longitudinal cross sectional view of an inspection substrate provided at an assembly sheet according to a second embodiment.

As for an assembly sheet according to the second embodiment, differences from the assembly sheet 500 according to the first embodiment will be described. FIG. 21 is a longitudinal cross sectional view of an inspection substrate provided in the assembly sheet according to the second embodiment. The longitudinal cross sectional view of FIG. 21 corresponds to the longitudinal cross sectional view of FIG. 9.

As shown in FIG. 21, in the present embodiment, a via v3 electrically connecting the inspection conductor layer 61 to the support substrate 310 is formed in the first insulating layer 410. In this case, the two probes of the inspection device are respectively brought into contact with the plating layer 70 covering the inspection conductor layer 61 and the support substrate 310. Thus, electric characteristics (a resistance value in the present example) of the via v3 can be measured.

The via v3 passing through the first insulating layer 410 has the same configuration as each of the vias va2, vb2 (FIG. 8) passing through the first insulating layer 210. Therefore, the resistance value of the via v3 of each inspection substrate 200 and the resistance value of each of the vias va2, vb2 of each suspension board 100 have a high correlation. Therefore, whether the electric characteristics of each of the vias va2, vb2 of the plurality of suspension board 100 are good can be further inspected by measurement of the resistance value of the via v3 of the inspection substrate 200.

When the assembly sheet 500 according to the present embodiment is manufactured, a through hole 424 (FIG. 21) for the via v3 is formed in the first insulating layer 410 in the process of FIGS. 11A to 11D. Thus, a conductive material is filled in the through hole 424 in the process of FIGS. 12A to 12D, and the via v3 is formed.

[3] Third Embodiment

Figure 22:
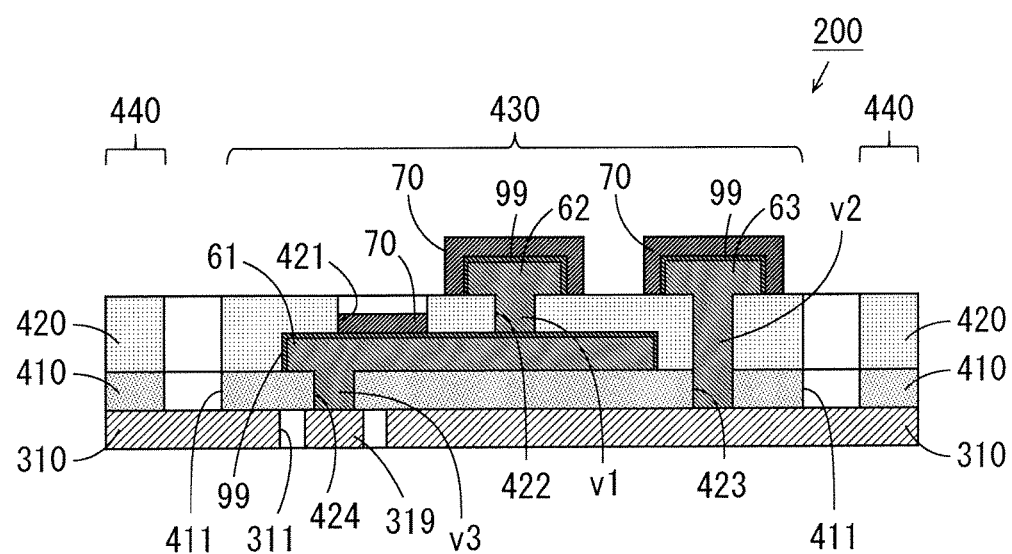
FIG. 22 is a longitudinal cross sectional view of an inspection substrate provided at an assembly sheet according to a third embodiment.

As for an assembly sheet according to the third embodiment, differences from the assembly sheet 500 according to the second embodiment will be described. FIG. 22 is a longitudinal cross sectional view of an inspection substrate provided in the assembly sheet according to the third embodiment. The longitudinal cross sectional view of FIG. 22 corresponds to the longitudinal cross sectional view of FIG. 9.

As shown in FIG. 22, in the present embodiment, an annular opening 311 is formed in the support substrate 310 to surround a portion electrically connected to the via v3. Thus, the portion connected to the via v3 of the support substrate 310 is formed in an island-shape in the opening 311 as a power supply connector (a connector for power supply) 319, and is electrically separated from the rest of the support substrate 310. Further, in the present example, a nickel plating layer 99 is formed on the outer surface of each of the inspection conductor layers 61, 62, 63.

In the process of manufacturing the assembly sheet 500, in a period after the process of FIGS. 13A to 13D and before the process of FIGS. 14A to 14D, electric power can be supplied to the write wiring traces 120, 130 through the vias va2, vb2 from the jumper wires JL1, JL2. Further, in a period after the process of FIGS. 17A to 17D and before the process of FIGS. 18A to 18D, electric power can be supplied to the write wiring traces 120, 130 through the vias va3, vb3 from the jumper wires JL1, JL2. Therefore, the nickel plating layer 99 (see FIGS. 20A to 20D) can be formed on the outer surface of each of the write wiring traces 120, 130 by the electrolytic plating method.

As described above, in the case where the nickel plating layer 99 is formed on the outer surface of each of the write wiring traces 120, 130 by the electrolytic plating method, the opening 311 is formed in the support substrate 530 in the process of FIGS. 13A to 13D. Thus, in a period after the process of FIGS. 13A to 13D and before the process of FIGS. 14A to 14D, the nickel plating layer 99 can be formed on the outer surface of the inspection conductor layer 61 by the electrolytic plating method by supply of electric power to the power supply connector 319. Further, in a period after the process of FIGS. 17A to 17D and before the process of FIGS. 18A to 18D, the nickel plating layer 99 can be formed on the outer surface of each of the inspection conductor layers 62, 63 by the electrolytic plating method by supply of electric power to the power supply connector 319 and the portions of the support substrate 310 except for the power supply connector 319.

In this case, the state of the outer surface of each of the write wiring traces 120, 130 and the element wiring trace 160 is equal to the state of the outer surface of each of the inspection conductor layers 61, 62, 63. Further, each of the jumper wires JL1, JL2 in the suspension board 100 and the power supply connector 319 in the inspection substrate 200 have the same configuration. Further, peripheral portions of each of the vias va1, vb1, vc1 of the suspension board 100 (FIG. 8), and peripheral portions of the via v1 of the inspection substrate 200 have the same configuration. Further, peripheral portions of each of the vias va3, vb3 of the suspension board 100 (FIG. 8) and peripheral portions of the via v2 of the inspection substrate 200 have the same configuration.

Thus, the resistance value of the via v1 of each inspection substrate 200 and the resistance value of each of the vias va1, vb1, vc1 of each suspension board 100 have a higher correlation. Further, the resistance value of the via v2 of each inspection substrate 200 and the resistance value of each of the vias va3, vb3 of each suspension board 100 have a higher correlation. Therefore, reliability of the result of inspection for each of the vias va1, va3, vb1, vb3, vc1 of the plurality of suspension boards 100 can be more sufficiently improved by measurement of the electric characteristics of each of the vias v1, v2 of the inspection substrate 200.

[4] Fourth Embodiment

Figure 23:
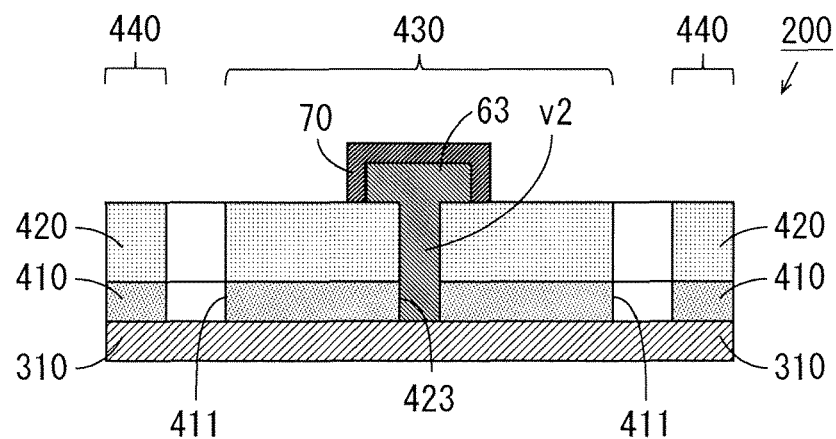
FIG. 23 is a longitudinal cross sectional view of an inspection substrate provided at an assembly sheet according to a fourth embodiment.

As for an assembly sheet according to the fourth embodiment, differences from the assembly sheet 500 according to the first embodiment will be described. FIG. 23 is a longitudinal cross sectional view of an inspection substrate provided at the assembly sheet according to the fourth embodiment. The longitudinal cross sectional view of FIG. 23 corresponds to the longitudinal cross sectional view of FIG. 9.

The inspection substrate 200 of FIG. 23 is not provided with the inspection conductor layer 61, the inspection conductor layer 62, the through hole 422 and the via v1 of the constituent elements of the inspection substrate 200 of FIG. 9. In the present embodiment, similarly to the first embodiment, whether the electric characteristics of each of the vias va3, vb3 of the plurality of suspension boards 100 are good can be inspected by measurement of the resistance value of the via v2 of the inspection substrate 200.

Therefore, in the case where the via that is a target of inspection is limited to each of the vias va3, vb3 passing through the first insulating layer 210 and the second insulating layer 220, the configuration of the inspection substrate 200 can be simplified by the use of the inspection substrate 200 of the present example.

[5] Fifth Embodiment

Figure 24:
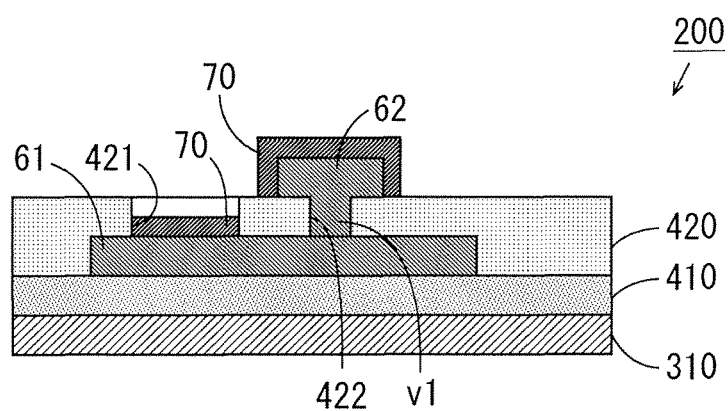
FIG. 24 is a longitudinal cross sectional view of an inspection substrate provided at an assembly sheet according to a fifth embodiment.

As for an assembly sheet according to the fifth embodiment, differences from the assembly sheet 500 according to the first embodiment will be described. FIG. 24 is a longitudinal cross sectional view of an inspection substrate provided at the assembly sheet according to the fifth embodiment. The longitudinal cross sectional view of FIG. 24 corresponds to the longitudinal cross sectional view of FIG. 9.

The inspection substrate 200 of FIG. 24 is not provided with the inspection conductor layer 63, the opening 411, the through hole 423 and the via v2 of the constituent elements of the inspection substrate 200 of FIG. 9. In the present embodiment, similarly to the first embodiment, whether the electric characteristics of each of the vias va1, vb1, vc1 of the plurality of suspension boards 100 are good can be inspected by measurement of the resistance value of the via v1 of the inspection substrate 200.

Therefore, in the case where the via that is a target of inspection is limited to each of the vias va1, vb1, vc1 passing through only the second insulating layer 420, the configuration of the inspection substrate 200 can be simplified by the use of the inspection substrate 200 of the present example.

[6] Sixth Embodiment

Figure 25:
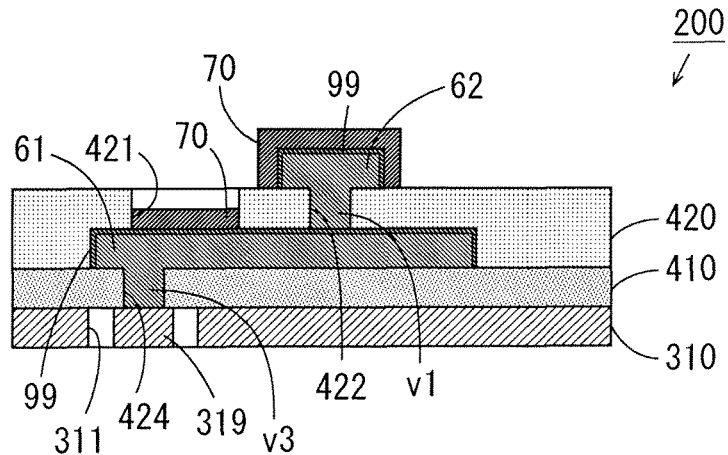
FIG. 25 is a longitudinal cross sectional view of an inspection substrate provided at an assembly sheet substrate according to a sixth embodiment.

As for an assembly sheet according to the sixth embodiment, differences from the assembly sheet 500 according to the fifth embodiment will be described. FIG. 25 is a longitudinal cross sectional view of an inspection substrate provided at the assembly sheet according to the sixth embodiment. The longitudinal cross sectional view of FIG. 25 corresponds to the longitudinal cross sectional view of FIG. 9.

In addition to the configuration of the inspection substrate 200 of FIG. 24, the inspection substrate 200 of FIG. 25 is provided with the opening 311, the supply power connector 319, the through hole 424 and the via v3 of FIG. 22. Further, the nickel plating layer 99 is formed on the outer surface of each of the inspection conductor layers 61, 62.

In this manner, in the inspection substrate 200 of the present example, the via v3 and the power supply connector 319 are provided, so that effects similar to the third embodiment can be acquired. That is, in the case where the nickel plating layer 99 is formed on the outer surface of each of the write wiring traces 120, 130 by the electrolytic plating method, the nickel plating layer 99 can be formed also on the outer surface of the inspection conductor layer 61 by the electrolytic plating method. Therefore, the configuration of the peripheral portions of the via v1 can be equal to the configuration of the peripheral portions of each of the vias va1, vb1, vc1. As a result, reliability of the result of inspection of each of the vias va1, vb1, vc1 of the plurality of suspension boards 100 can be more sufficiently improved by measurement of the electric characteristics of the via v1 of the inspection substrate 200.

[7] Seventh Embodiment

As for an assembly sheet according to the seventh embodiment, differences from the assembly sheet 500 according to the first embodiment will be described. In the following description, an inspection substrate 200 of FIG. 23 according to the fourth embodiment is referred to as an inspection substrate 200A, and the inspection substrate 200 of FIG. 24 according to the fifth embodiment is referred to as an inspection substrate 200B.

Figure 26:
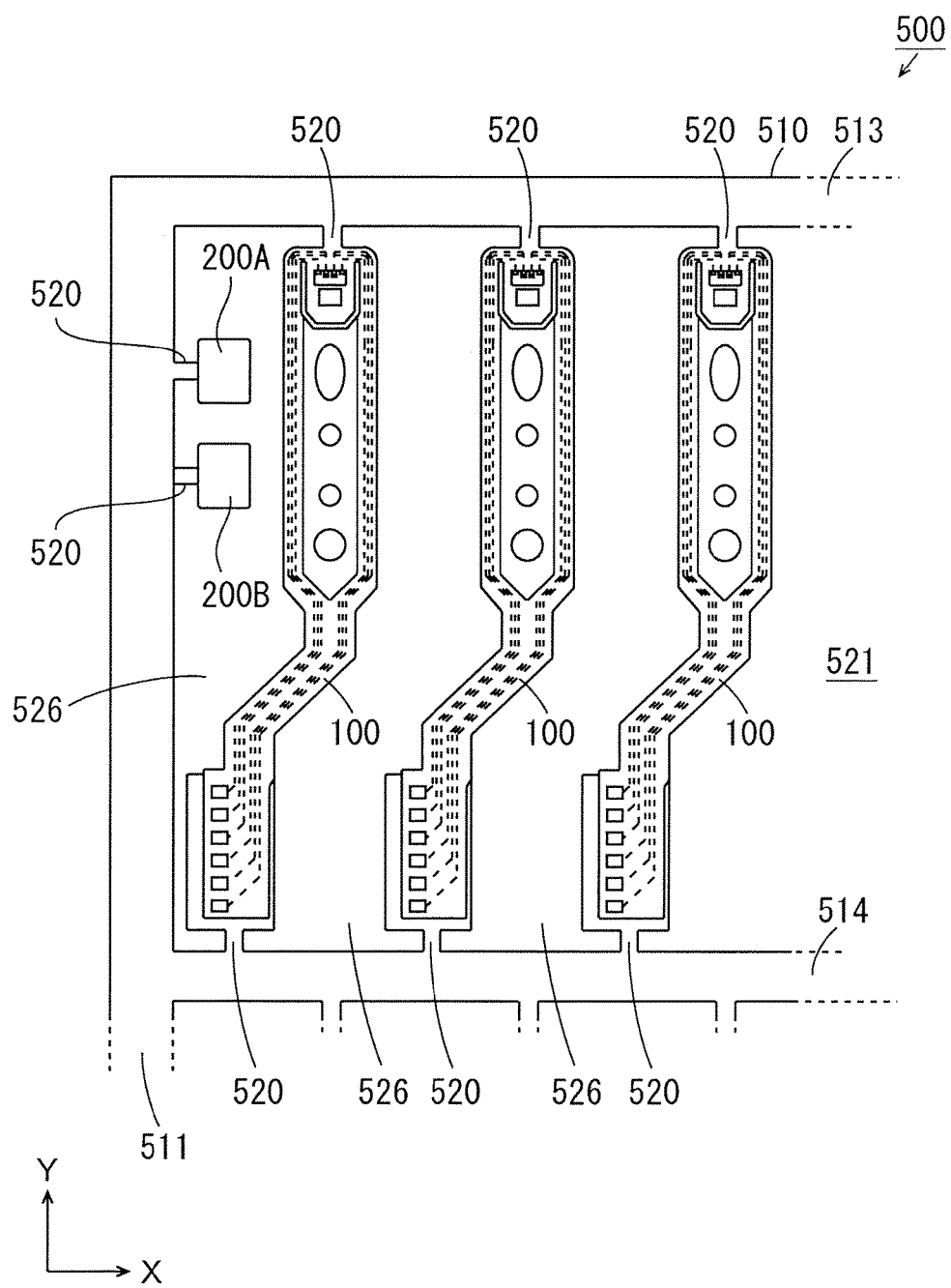
FIG. 26 is a top view of an assembly sheet according to a seventh embodiment.

FIG. 26 is a top view of the assembly sheet according to the seventh embodiment. As shown in FIG. 26, the assembly sheet 500 according to the present embodiment includes the inspection substrate 200A of FIG. 23 and the inspection substrate 200B of FIG. 24.

In this case, a manufacturer of the assembly sheet 500 can inspect whether the electric characteristics of each of the vias va3, vb3 of each of the plurality of suspension boards 100 are good by measuring the resistance value of the via v2 of the inspection substrate 200A.

Further, the manufacturer of the assembly sheet 500 can inspect whether the electric characteristics of each of the vias va1, vb1, vc1 of each of the plurality of suspension boards 100 are good by measuring the resistance value of the via v1 of the inspection substrate 200B. In the present embodiment, the inspection substrate 200 of FIG. 25 may be used as the inspection substrate 200B.

[8] Eighth Embodiment

As for an assembly sheet according to the eighth embodiment, differences from the assembly sheet 500 according to the first embodiment will be described. FIG. 27 is a top view of the assembly sheet 500 according to the eighth embodiment. In the assembly sheet 500 of FIG. 27, the inspection substrate 200 is provided in the separation groove 526 between a pair of adjacent suspension boards 100 in the X direction of the plurality of suspension boards 100 in each of the rectangular regions 521 to 525. In this case, a correlation between the electric characteristics of the via v1 of the inspection substrate 200 and the electric characteristics of each of the vias va1, vb1, vc1 of each of the plurality of suspension boards 100, and a correlation between the electric characteristics of the via v2 of the inspection substrate 200 and the electric characteristics of each of the vias va3, vb3 of each of the plurality of suspension boards 100 can be improved.

Further, the inspection substrate 200 may be supported at the support frame 510 by the suspension boards 100 on both sides, or may be supported at the support frame 510 by only the suspension board 100 on one side. Alternatively, the inspection substrate 200 may be directly supported at the support frame 510 without suspension board 100.

[9] Ninth Embodiment

Figure 28:
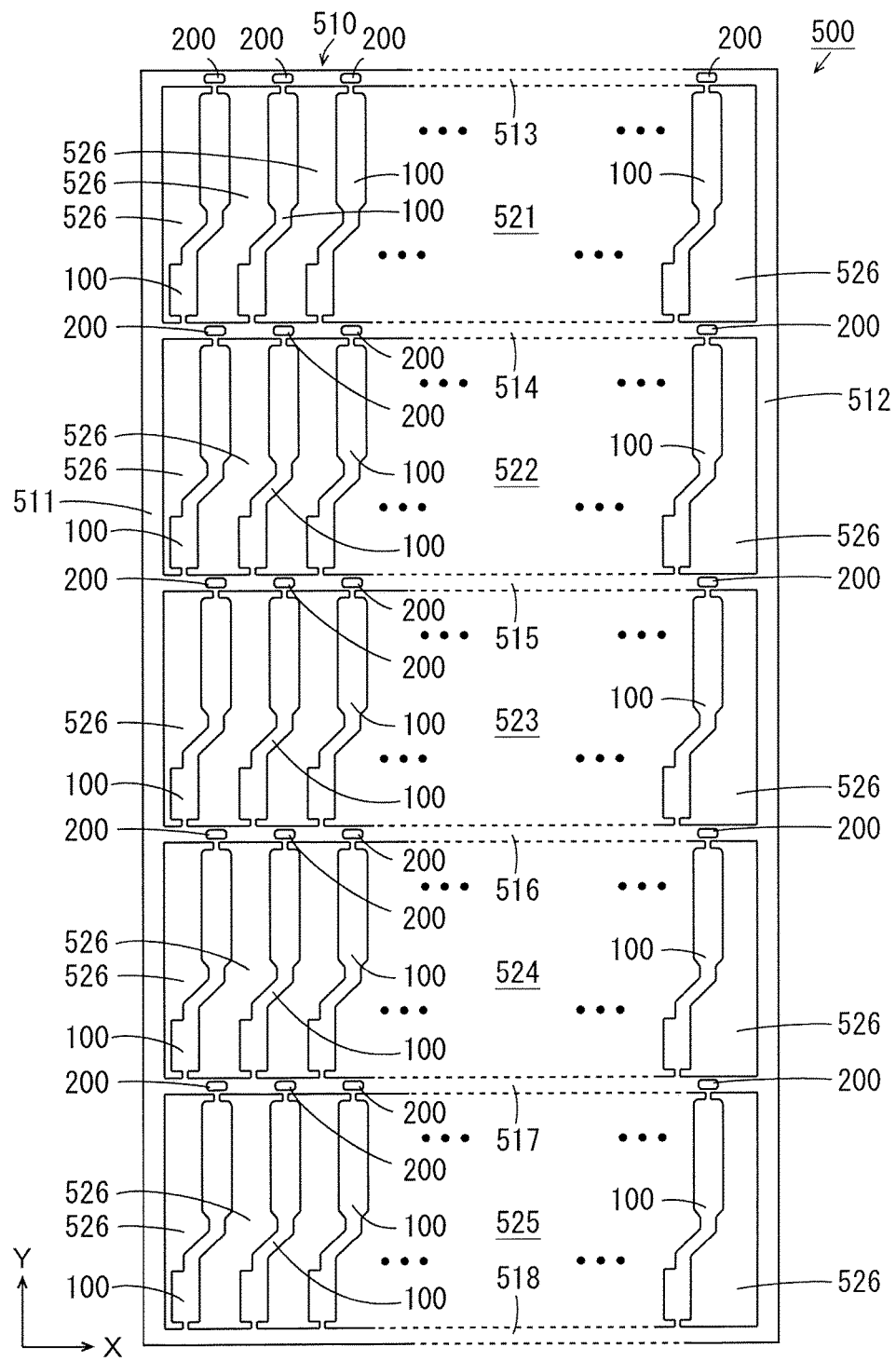
FIG. 28 is a top view of an assembly sheet according to a ninth embodiment.

As for an assembly sheet according to the ninth embodiment, differences from the assembly sheet 500 according to the first embodiment will be described. FIG. 28 is a top view of the assembly sheet 500 according to the ninth embodiment. In the assembly sheet 500 of FIG. 28, the plurality of inspection substrates 200 are arranged in the support frame 510. Further, the plurality of inspection substrates 200 are formed to correspond to the plurality of suspension boards 100, respectively. In this case, it is not necessary to separately provide a space for arrangement of the plurality of inspection substrates 200. Further, it is not necessary to provide another member for supporting the plurality of inspection substrates 200 at the support frame 510. Thus, the configuration of the assembly sheet 500 can be simplified, and the size of the assembly sheet 500 can be reduced.

[10] Other Embodiments

In the first embodiment, the inspection substrate 200 is provided in each of the separation groove 526 between the suspension board 100 at the one end in the X direction in each of the rectangular regions 521 to 525 and the side frame 511, and the separation groove 526 between the suspension board 100 at the other end in the X direction in each of the rectangular regions 521 to 525 and the side frame 512. However, the present invention is not limited to this.

The inspection substrate 200 may be provided in the separation groove 526 between the suspension board 100 at the one end in the X direction in each of the rectangular regions 521 to 525 and the side frame 511, and the inspection substrate 200 does not have to be provided in the separation groove 526 between the suspension board 100 at the other end in the X direction in each of the rectangular regions 521 to 525 and the side frame 512. Alternatively, the inspection substrate 200 may be provided in the separation groove 526 between the suspension board 100 at the other end in the X direction in each of the rectangular regions 521 to 525 and the side frame 511, and the inspection substrate 200 does not have to be provided in the separation groove 526 between the suspension board 100 at the one end in the X direction in each of the rectangular regions 521 to 525 and the side frame 512.

[11] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the present embodiment, the plurality of suspension boards 100 is an example of a plurality of suspension boards having circuits, the inspection substrate 200 is an example of an inspection substrate, the support frame 510 is an example of a support frame and the support substrate 110 is an example of a circuit support substrate.

Further, the first insulating layer 210 is an example of a first circuit insulating layer, the lines LA3, LA5, LB3, LB5 are examples of a first conductor line, the second insulating layer 220 is an example of a second circuit insulating layer, the lines LA1, LA2, LA4, LB1, LB2, LB4 are examples of a second conductor line and the vias va1, vb1, vc1 are examples of a first circuit via.

Further, the support substrate 310 is an example of an inspection support substrate, the first insulating layer 410 is an example of a first inspection insulating layer, the inspection conductor layer 61 is an example of a first inspection conductor layer, the second insulating layer 420 is an example of a second inspection insulating layer, the inspection conductor layers 62, 63 are examples of a second inspection conductor layer, the inspection conductor layer 63 is an example of an inspection conductor layer, the via v1 is an example of a first inspection via, and the assembly sheet 500 is an example of a suspension board assembly sheet having circuits.

Further, the vias va3, vb3 are examples of a second circuit via and a circuit via, the via v2 is an example of a second inspection via and an inspection via, the vias va2 vb2 are examples of a third circuit via, the via v3 is an example of a third inspection via, and the openings 411, 421 are examples of an opening.

Further, a portion except for the jumper wires JL1, JL2 of the support substrate 110 is an example of a circuit supporter (a supporter for a circuit), the jumper wires JL1, JL2 are examples of a circuit connector (a connector for a circuit), a portion except for the supply connector 319 of FIGS. 22 and 25 of the support substrate 310 is an example of an inspection supporter (a supporter for inspection), and the power supply connector 319 of FIGS. 22 and 25 is an example of an inspection connector (a connector for inspection).

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of printed circuit boards.

We claim:
1. A suspension board assembly sheet having circuits, comprising:
   a plurality of suspension boards having circuits;
   an inspection substrate; and
   a support frame that integrally supports the plurality of suspension boards having circuits and the inspection substrate, wherein
   each of the plurality of suspension boards having circuits includes
   a conductive circuit support substrate,
   a first circuit insulating layer formed on the circuit support substrate,
   a first conductor line formed on the first circuit insulating layer,
   a second circuit insulating layer formed on the first circuit insulating layer to cover at least part of the first conductor line,
   a second conductor line formed on the second circuit insulating layer, and
   a first circuit via that electrically connects the first conductor line to the second conductor line through the second circuit insulating layer,
   the inspection substrate includes
   a conductive inspection support substrate,
   a first inspection insulating layer formed on the inspection support substrate,
   a first inspection conductor layer formed on the first inspection insulating layer,
   a second inspection insulating layer formed on the first inspection insulating layer to cover at least part of the first inspection conductor layer,
   a second inspection conductor layer formed on the second inspection insulating layer, and
   a first inspection via that electrically connects the first inspection conductor layer to the second inspection conductor layer through the second inspection insulating layer, and
   the first circuit via and the first inspection via have a same configuration.
2. The suspension board assembly sheet having circuits according to claim 1, wherein
   each of the plurality of suspension boards having circuits further includes a second circuit via that electrically connects the circuit support substrate to the second conductor line through the first and second circuit insulating layers,
   the inspection substrate further includes a second inspection via that electrically connects the inspection support substrate to the second inspection conductor layer through the first and second inspection insulating layers, and the second circuit via and the second inspection via have a same configuration.

3. The suspension board assembly sheet having circuits according to claim 1, wherein each of the plurality of suspension boards having circuits further includes a third circuit via that electrically connects the circuit support substrate to the first conductor line through the first circuit insulating layer, the inspection substrate further includes a third inspection via that electrically connects the inspection support substrate to the first inspection conductor layer through the first inspection insulating layer, and the third circuit via and the third inspection via have a same configuration.

4. The suspension board assembly sheet having circuits according to claim 3, wherein the circuit support substrate includes a circuit supporter that supports the first circuit insulating layer, the first conductor line, the second circuit insulating layer, and the second conductor line, and a circuit connector that is electrically connected to the third circuit via and electrically separated from the circuit supporter, and the inspection support substrate includes an inspection supporter that supports the first inspection insulating layer, the first inspection conductor layer, the second inspection insulating layer and the second inspection conductor layer, and an inspection connector that is electrically connected to the third inspection via and electrically separated from the inspection supporter.

5. The suspension board assembly sheet having circuits according to claim 1, wherein the second inspection insulating layer has an opening from which part of the first inspection conductor layer is exposed.

6. The suspension board assembly sheet having circuits according to claim 1, wherein the support frame surrounds at least part of the plurality of suspension boards having circuits, and the inspection substrate is arranged in a region surrounded by the support frame.

7. The suspension board assembly sheet having circuits according to claim 6, wherein the support frame surrounds the plurality of suspension boards having circuits, and the plurality of suspension boards having circuits and the inspection substrate are supported in alignment at the support frame.

8. The suspension board assembly sheet having circuits according to claim 7, wherein the inspection substrate is arranged between a suspension board having a circuit at an end of the plurality of suspension boards having circuits, and a portion of the support frame.

9. The suspension board assembly sheet having circuits according to claim 7, wherein the inspection substrate is arranged between a pair of adjacent suspension boards having circuits of the plurality of suspension boards having circuits.

10. A method of inspecting a suspension board assembly sheet having circuits, including the steps of:

preparing the suspension board assembly sheet having circuits according to claim 1, and performing inspection of the first circuit via by measuring electric characteristics of the first inspection via.

11. A suspension board assembly sheet having circuits, comprising:

a plurality of suspension boards having circuits;

an inspection substrate; and a support frame that integrally supports the plurality of suspension boards having circuits and the inspection substrate, wherein each of the plurality of suspension boards having circuits includes a conductive circuit support substrate, a first circuit insulating layer formed on the circuit support substrate, a first conductor line formed on the first circuit insulating layer, a second circuit insulating layer formed on the first circuit insulating layer to cover at least part of the first conductor line, a second conductor line formed on the second circuit insulating layer, and a circuit via that electrically connects the circuit support substrate to the second conductor line through the first and second circuit insulating layers, the inspection substrate includes a conductive inspection support substrate, a first inspection insulating layer formed on the inspection support substrate, a second inspection insulating layer formed on the first inspection insulating layer, an inspection conductor layer formed on the second inspection insulating layer, and an inspection via that electrically connects the inspection support substrate to the inspection conductor layer through the first and second inspection insulating layers, and the circuit via and the inspection via have a same configuration.

12. The suspension board assembly sheet having circuits according to claim 11, wherein the first and second inspection insulating layers have an opening from which part of the inspection support substrate is exposed.

13. The suspension board assembly sheet having circuits according to claim 11, wherein the support frame surrounds at least part of the plurality of suspension boards having circuits, and the inspection substrate is arranged in a region surrounded by the support frame.

14. The suspension board assembly sheet having circuits according to claim 13, wherein the support frame surrounds the plurality of suspension boards having circuits, and the plurality of suspension boards having circuits and the inspection substrate are supported in alignment at the support frame.

15. The suspension board assembly sheet having circuits according to claim 14, wherein the inspection substrate is arranged between a suspension board having a circuit at an end of the plurality of suspension boards having circuits, and a portion of the support frame.

16. The suspension board assembly sheet having circuits according to claim 14, wherein the inspection substrate is arranged between a pair of adjacent suspension boards having circuits of the plurality of suspension boards having circuits.

17. A method of inspecting a suspension board assembly sheet having circuits, including the steps of:
preparing the suspension board assembly sheet having circuits according to claim 11, and
performing inspection of the circuit via by measuring electric characteristics of the inspection via.

18. A method of manufacturing a suspension board assembly sheet having circuits including a plurality of suspension boards having circuits, an inspection substrate and a support frame that integrally supports the plurality of suspension boards having circuits and the inspection substrate, including the steps of:
preparing a base material having a laminated structure of a conductive support substrate and an insulating layer;
forming a plurality of first circuit insulating layers for the plurality of suspension boards having circuits and a first inspection insulating layer for the inspection substrate by processing the insulating layer;
respectively forming a plurality of first conductor lines on the plurality of first circuit insulating layers, and forming a first inspection conductor layer on the first inspection insulating layer;
respectively forming a plurality of second circuit insulating layers on the plurality of first circuit insulating layers to cover at least part of the plurality of first conductor lines, and forming a second inspection insulating layer on the first inspection insulating layer to cover at least part of the first inspection conductor layer;
respectively forming a plurality of first circuit vias electrically connected to the plurality of first conductor lines in the plurality of second circuit insulating layers, respectively forming a plurality of second conductor lines on the plurality of second circuit insulating layers to be electrically connected to the plurality of first circuit vias, forming a first inspection via electrically connected to the first inspection conductor layer in the second inspection insulating layer, and forming a second inspection conductor layer on the second inspection insulating layer to be electrically connected to the first inspection via; and
fabricating the plurality of suspension boards having circuits, the inspection substrate and the support frame by removing a region of the support substrate except for a region for the plurality of suspension boards having circuits, a region for the inspection substrate, and a region for the support frame in the support substrate.

19. The method of manufacturing the suspension board assembly sheet having circuits according to claim 18, wherein the step of forming the plurality of second conductor lines and the second inspection conductor layer includes respectively forming a plurality of second circuit vias electrically connected to the support substrate in the plurality of first and second circuit insulating layers, respectively forming the plurality of second conductor lines on the plurality of second circuit insulating layers to be electrically connected to the plurality of second circuit vias, forming a second inspection via electrically connected to the support substrate in the first and second insulating layers, and forming the second inspection conductor layer on the second inspection insulating layer to be electrically connected to the second inspection via.

20. A method of manufacturing a suspension board assembly sheet having circuits including a plurality of suspension boards having circuits, an inspection substrate and a support frame that integrally supports the plurality of suspension boards having circuits and the inspection substrate, including the steps of:
preparing a base material having a laminated structure of a conductive support substrate and an insulating layer;
forming a plurality of first circuit insulating layers for the plurality of suspension boards having circuits and a first inspection insulating layer for the inspection substrate by processing the insulating layer;
respectively forming a plurality of first conductor lines on the plurality of first circuit insulating layers;
respectively forming a plurality of second circuit insulating layers on the plurality of first circuit insulating layers to cover at least part of the plurality of first conductor lines, and forming a second inspection insulating layer on the first inspection insulating layer;
respectively forming a plurality of circuit vias electrically connected to the support substrate in the plurality of first and second circuit insulating layers, respectively forming a plurality of second conductor lines on the plurality of second circuit insulating layers to be electrically connected to the plurality of circuit vias, forming an inspection via electrically connected to the support substrate in the first and second inspection insulating layers, and forming an inspection conductor layer on the second inspection insulating layer to be electrically connected to the inspection via, and
fabricating the plurality of suspension boards having circuits, the inspection substrate and the support frame by removing a region of the support substrate except for a region for the plurality of suspension boards having circuits, a region for the inspection substrate and a region for the support frame in the support substrate.

* * * * *